United States Patent
Eitan et al.

(10) Patent No.: US 8,208,300 B2
(45) Date of Patent: Jun. 26, 2012

(54) NON-VOLATILE MEMORY CELL WITH INJECTOR

(75) Inventors: Boaz Eitan, Hofit (IL); Maria Kushnir, Nesher (IL); Assaf Shappir, Kiryat Ono (IL)

(73) Assignee: Spansion Israel Ltd, Netanya (IL)

( * ) Notice: Subject to any disclaimer, the term of this patent is extended or adjusted under 35 U.S.C. 154(b) by 651 days.

(21) Appl. No.: 12/318,789

(22) Filed: Jan. 8, 2009

(65) Prior Publication Data
US 2009/0201741 A1 Aug. 13, 2009

Related U.S. Application Data

(60) Provisional application No. 61/006,354, filed on Jan. 8, 2008.

(51) Int. Cl.
*G11C 11/34* (2006.01)

(52) U.S. Cl. .................. 365/185.05; 257/314; 257/315

(58) Field of Classification Search ............. 365/185.05; 257/314, 315
See application file for complete search history.

(56) References Cited

U.S. PATENT DOCUMENTS

| | | | |
|---|---|---|---|
| 4,538,196 A | 8/1985 | Sun et al. | |
| 4,547,599 A | 10/1985 | Schneider et al. | |
| 4,547,617 A | 10/1985 | Welch | |
| 4,939,449 A * | 7/1990 | Cattaneo et al. | 324/117 R |
| 5,286,994 A | 2/1994 | Ozawa et al. | |
| 5,319,229 A | 6/1994 | Shimoji et al. | |
| 5,746,591 A | 5/1998 | Yao | |
| 5,952,692 A | 9/1999 | Nakazato et al. | |
| 5,963,465 A | 10/1999 | Eitan | |
| 5,966,603 A | 10/1999 | Eitan | |
| 6,011,725 A | 1/2000 | Eitan | |
| 6,026,026 A | 2/2000 | Chan et al. | |
| 6,030,871 A | 2/2000 | Eitan | |
| 6,074,917 A | 6/2000 | Chang et al. | |
| 6,133,095 A | 10/2000 | Eitan et al. | |
| 6,169,693 B1 | 1/2001 | Chan et al. | |
| 6,215,148 B1 | 4/2001 | Eitan | |
| 6,218,700 B1 | 4/2001 | Papadas | |
| 6,233,180 B1 | 5/2001 | Eitan et al. | |
| 6,285,574 B1 | 9/2001 | Eitan | |
| 6,292,394 B1 | 9/2001 | Cohen et al. | |

(Continued)

OTHER PUBLICATIONS

A Novel Gate-Injection Program/Erase P-Channel NAND-Type Flash Memory with High (10M Cycle Endurance), Hang-Ting Lue et al., Macronix International Co. Ltd., 2007 Symposium on VLSI Technology Digest of Papers, 978-4-900784-03-1, pp. 140-141.

Be-Sonos: A Bandgap Engineered SONOS with Excellent Performance and Reliability, Hang-Ting Lue et al., Macronix International Co. Ltd., © 2005, IEEE 0-7803-9269-8/05.

(Continued)

*Primary Examiner* — Son Dinh

(74) *Attorney, Agent, or Firm* — Eitan Mehulal & Sadot

(57) ABSTRACT

In a nonvolatile memory (NVM) cell, an injector having one or more layers of material with a lower potential barrier for holes is disposed between a charge storage stack and a source of holes (the gate for top injection, the substrate for bottom injection), to facilitate hole tunneling from the source of holes into the charge-storage layer of the charge storage stack. The injector has a barrier potential for holes which is less than an insulating layer of the charge-storage stack which is oriented towards the source of holes. A multi-layer crested barrier injector may have layers of increasing potential barriers for holes from the source to the charge-storage layer. Methods of operating NVM cells are disclosed. The NVM cell may be NROM, SONOS, or other oxide-nitride technology NVM cells such as SANOS, MANOS, TANOS.

56 Claims, 9 Drawing Sheets

U.S. PATENT DOCUMENTS

| | | | |
|---|---|---|---|
| 6,395,644 | B1 | 5/2002 | Hoppeer et al. |
| 6,448,750 | B1 | 9/2002 | Shor et al. |
| 6,477,084 | B1 | 11/2002 | Eitan |
| 6,512,696 | B1 | 1/2003 | Fan et al. |
| 6,583,007 | B1 | 6/2003 | Eitan |
| 6,633,496 | B2 | 10/2003 | Mayyan et al. |
| 6,709,928 | B1 | 3/2004 | Jenne et al. |
| 6,720,630 | B2 | 4/2004 | Mandelman et al. |
| 6,818,558 | B1 | 11/2004 | Rathor et al. |
| 6,897,533 | B1 | 5/2005 | Yang et al. |
| 6,912,163 | B2 | 6/2005 | Zheng et al. |
| 6,942,320 | B2 | 9/2005 | Chung et al. |
| 6,954,393 | B2 | 10/2005 | Lusky et al. |
| 6,967,896 | B2 | 11/2005 | Eisen et al. |
| 6,980,471 | B1 * | 12/2005 | Samachisa ............... 365/185.02 |
| 7,062,619 | B2 | 6/2006 | Dvir et al. |
| 7,075,828 | B2 | 7/2006 | Lue et al. |
| 7,115,469 | B1 | 10/2006 | Halliyal et al. |
| 7,115,942 | B2 | 10/2006 | Wang |
| 7,133,313 | B2 | 11/2006 | Shih |
| 7,135,734 | B2 | 11/2006 | Eldridge et al. |
| 7,151,692 | B2 | 12/2006 | Wu |
| 7,157,769 | B2 | 1/2007 | Forbes |
| 7,164,603 | B2 | 1/2007 | Shih et al. |
| 7,187,590 | B2 | 3/2007 | Zous et al. |
| 7,190,614 | B2 | 3/2007 | Wu |
| 7,209,390 | B2 | 4/2007 | Lue et al. |
| 7,253,467 | B2 * | 8/2007 | Lee et al. ....................... 257/315 |
| 7,315,474 | B2 | 1/2008 | Lue |
| 2005/0006696 | A1 | 1/2005 | Noguchi et al. |
| 2005/0157549 | A1 | 7/2005 | Mokhlesi et al. |
| 2005/0219906 | A1 | 10/2005 | Wu |
| 2005/0237801 | A1 | 10/2005 | Shih |
| 2005/0237809 | A1 | 10/2005 | Shih et al. |
| 2005/0237813 | A1 | 10/2005 | Zous et al. |
| 2005/0237815 | A1 | 10/2005 | Lue et al. |
| 2005/0237816 | A1 | 10/2005 | Lue et al. |
| 2005/0281085 | A1 | 12/2005 | Wu |
| 2006/0084219 | A1 | 4/2006 | Lusky et al. |
| 2006/0198189 | A1 | 9/2006 | Lue et al. |
| 2006/0202252 | A1 | 9/2006 | Wang et al. |
| 2006/0202261 | A1 | 9/2006 | Lue et al. |
| 2006/0281260 | A1 | 12/2006 | Lue |
| 2007/0029625 | A1 | 2/2007 | Lue et al. |
| 2007/0159880 | A1 | 7/2007 | Eitan |
| 2007/0195607 | A1 | 8/2007 | Eitan et al. |
| 2008/0251831 | A1 | 10/2008 | Wu et al. |

OTHER PUBLICATIONS

Eitan et al., NROM: A Novel Localized Trapping 2-Bit Nonvolatile Memory Cell, IEEE Electron Device Lett. vol. 21, No. 11, pp. 543-545 (2000).

Shapira et al., Unified Retention Model for localized charge-trapping nonvolatile memory device, Appl. Phys, Lett. 92, 133514 (2008).

*Layered tunnel barriers for nonvolatile memory devices*, Likharev, Appl. Phys. Lett., vol. 73, No. 15, Oct. 1998.

*VARIOT: a novel multilayer tunnel barrier concept for low-voltage non-volatile memory devices*, Govoreanu et al., IEEE Electron Device Letters, pp. 99-101, 2003 . . . IEEE electron device letters, pp. 99-101, 2003.

Reliability Model of Bandgap Engineered SONOS (BE-SONOS), Lue et al., MXIC IEDM, IEEE, 2006.

*Material Issues for Layered Tunnel Barrier Structures*, Casperon et al., Journal of Applied Physics, vol. 92, Nr. 1, Jul. 2002.

*Silicon-Nitride as a Tunnel Dielectric for Improved SONOS-Type Flash Memory*, She et al, IEEE Electron Device Letters, vol. 24, No. 5, May 2003.

*JVD Silicon Nitride sa Tunnel Dielectric in p-Channel Flash Memory*, She et al., IEEE Electron Device Letters, vol. 23, No. 2, Feb. 2002.

J. D. Bude, et al., "Secondary Electron Flash—a High Performance, Low Power Flash Technology for 0.35.mu.m and Below", IEDM 97, pp. 279-282.

J. D. Bude, et al., "EEPROM/Flash Sub 3.0V Drain-Source Bias Hot Carrier Writing", IEDM 95, pp. 989-992.

J. D. Bude and M. R. Pinto, "Modeling Nonequilibrium Hot Carrier Device Effects", Conference of Insulator Specialists of Europe, Sweden, Jun. 1997.

Scalable 2-bit silicon-oxide-nitride-oxide-silicon (SONOS) memory with physically separated local nitrides under a merged gate, Lee et al., (Samsung), Solid State Electronics 48 (2004). pp. 1771-1775.

Chisel Flash EEPROM—Part I: Performance and Scaling, Mahapatra, Shukuri, Bude, IEEE Transactions on Electron Devices, vol. 49. No. 7, Jul. 2002.

Chisel Programming Operation of Scaled NOR Flash EEPROMs—Effect of Voltage Scaling, Device Scaling and Technological Parameters, Mohapatra, Nair, Mahapatra, Rao, Shukuri, Bude, IEEE Transactions on Electron Devices, vol. 50. No. 10, Oct. 2003.

Scalable 2-bit silicon-oxide-nitride-oxide-silicon (SONOS) memory with physically separated local nitrides under a merged gate, Lee et al., (Samsung), Solid State Electronics 48 (2004), pp. 1771-1775.

\* cited by examiner

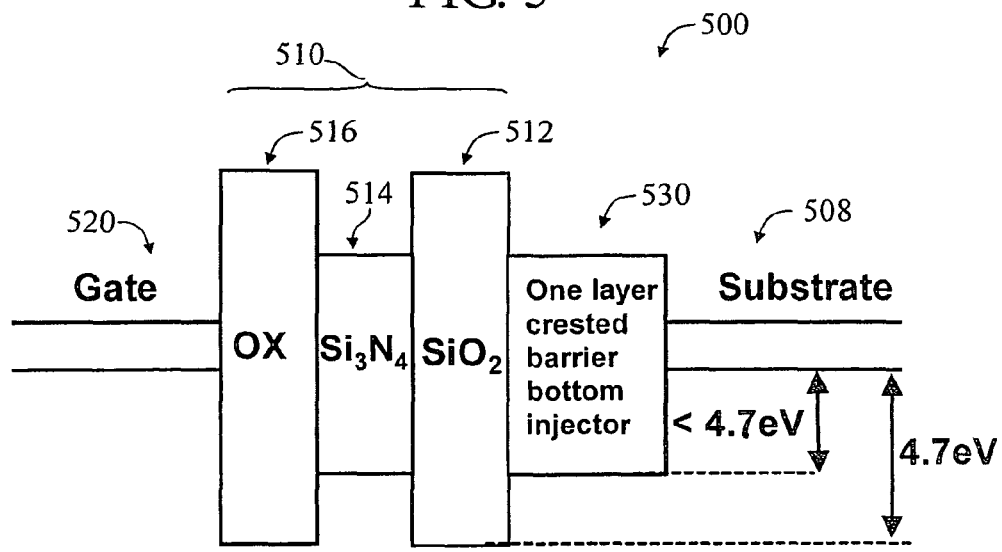
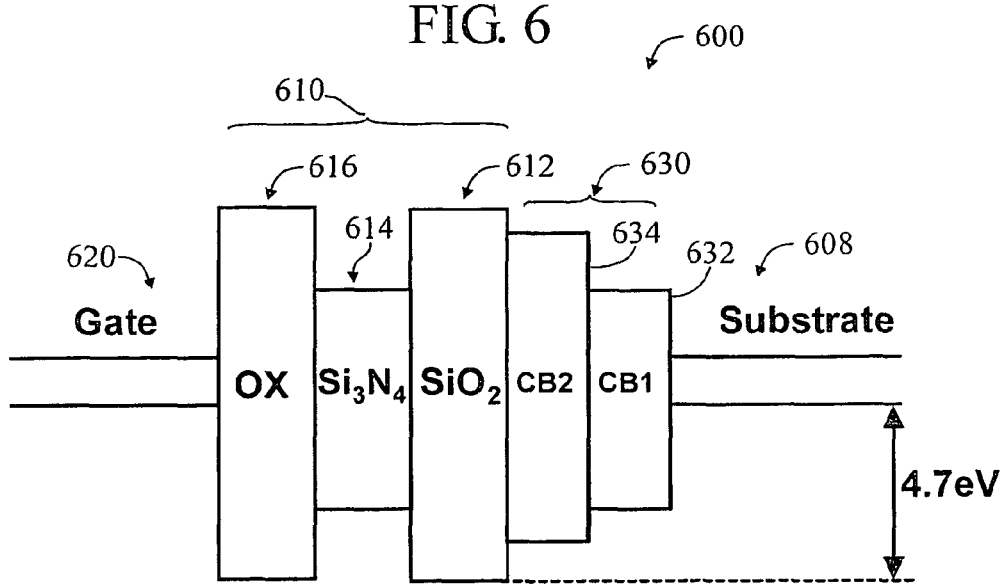

NON-VOLATILE MEMORY CELL WITH INJECTOR

CROSS-REFERENCE (S) TO RELATED APPLICATION(S)

This is a non-provisional filing based on U.S. Provisional Application No. 61/006,354, filed 8 Jan. 2008, incorporated in its entirety by reference herein.

TECHNICAL FIELD

This disclosure relates to the structure and operation of nitride read only memory (NROM) and other NVM cells using oxide-nitride technology, and other microelectronic devices and structures.

BACKGROUND

The NROM cell is a type of non-volatile memory (NVM) cell. The NROM cell is basically an n-channel MOSFET (metal-oxide-silicon, field effect transistor) device with an ONO (oxide-nitride-oxide) stack as a gate dielectric. Using nitride (silicon nitride, $Si_3N_4$) as a charge-trapping layer enables electrons (or holes) to be stored in two separate charge-storage areas, which may be referred to as two "bits", or two "half-cells". See, for example, Eitan et al., NROM: *A Novel Localized Trapping 2-Bit Nonvolatile Memory Cell*, IEEE Electron Device Lett. Vol 21, no. 11, pp 543-545 (2000), incorporated by reference in its entirety herein.

Generally, the quantity of electrons (or holes) stored in a given charge-storage area will control the threshold voltage of the half cell, and can be controlled to correspond to at least two distinct program levels. In a single-level cell (SLC) there may be two threshold voltage distributions representing, for example, binary "0" and binary "1". In a multi-level cell (MLC), there may be four (or more) threshold voltage distributions representing, for example, binary "00", "01", "10" and "11". A lowest one of the threshold voltage distributions may represent an erase state, and the other threshold voltage distributions may represent program state(s).

Programming of the NROM cell may be performed by Channel Hot Electron (CHE) injection or channel-initiated secondary electron (CHISEL) injection, to increase the threshold voltage of the half cell. Erase of the NROM cell may be performed by band-to-band Tunnel Assisted Hot Hole Injection (HHI), to reduce the threshold voltage of the half cell. Reading of the NROM cell may be performed by a reverse read method, to ascertain the threshold voltage of the half cell.

Structure of a Conventional ("Standard") NROM Cell

FIG. 1 is a cross-sectional view, of an exemplary NROM memory cell 500 generally comprising a substrate 102, a first diffusion 104 extending into the substrate 102 from a top (as viewed) surface thereof, a second diffusion 106 extending into the substrate 102 from a top (as viewed) surface thereof, a channel 108 disposed between the first diffusion 104 and the second diffusion 106, and an ONO stack ("charge-storage stack") 110 disposed on the top surface of the substrate 102. The ONO stack 110 comprises a first (or "bottom") oxide layer 112, a nitride ("storage") layer 114 disposed on the bottom oxide layer 112, and a second (or ("top") oxide layer 116 disposed on the storage layer 114. The storage nitride layer 114 may comprise two charge storage areas (or "bits"), a right "bit" 114R adjacent the right diffusion 104, and a left "bit" 114L above the left diffusion 106. A gate structure 120, such as polysilicon, is disposed on the top oxide layer 116.

The following materials, processes and dimensions may be exemplary (note that the drawing is not "to scale"):

The substrate 102 may be a P-type silicon substrate, or a "P-well" (as illustrated) which is formed in an N-type or P-type silicon substrate.

The first and second diffusions 104 and 106 may both be doped N+, and either may serve as source (S) or drain (D), depending on operating conditions. Generally, the memory cell has left-right (as viewed) "mirror symmetry".

The channel 108 may have a length (Leff, across the page, as viewed) of approximately 100 nm. (This dimension (Leff) depends on the "technology node", currently 100 nm, which is becoming smaller and smaller).

The ONO stack 110 may have a length dimension (Ld, "length drawn", across the page, as viewed) of approximately 120-150 nm, which is greater than the channel length (Leff). (This dimension (Ld) depends on the technology node.)

The channel 108 and the ONO stack 110 may both have a dimension, into the page (as viewed) of Wd (width drawn), typically slightly less than Leff, but may be slightly greater than Leff. This dimension generally depends on the process flow.

The bottom oxide layer 112 may comprise $SiO_2$, formed by oxidation, and may have a thickness of from 3.0 to 6.0 nm, for example (but not limited to) 4.0 nm.

The storage nitride layer 114 may comprise $Si_3N_4$, deposited by a CVD, such as LPCVD, and may have a thickness of from 3.0 to 8.0 nm, for example (but not limited to). 4.0 nm.

The top oxide layer 116 may comprise $SiO_2$, formed by nitride oxidation followed by oxide deposition, and may have a thickness of from 5.0 to 15.0 nm, for example (but not limited to) 10.0 nm.

The gate 120 may be doped N+.

Modes of NROM Operation

Voltages Vd and Vs, Vg and Vsub (or Vb) may be applied to each of the right and left diffusions 106 and 104, the gate 120 and the substrate 102, respectively, for operating the NROM cell. As will be noted, the left and right diffusions 104 and 106 may function as either source or drain, depending on the mode of operation.

For example to program the right bit 114R by channel hot electron (CHE) injection, the left diffusion 106 (acting as source, Vs) may be set to 0 volts (in an array, Vs may be set to between 0 volts and +0.7 volts), the right diffusion 104 (acting as drain, Vd) may be set to +5 volts, the gate 120 (Vg) may be set to +8-10 volts, and the substrate 102 (Vb, Vsub) may be set to 0 volts And, to program the left bit 114L, Vs and Vd would be interchanged.

For example, to erase the right bit 114R, by hot hole injection (HHI), the left diffusion 106 (acting as source, Vs) may be set to float (in an array, Vs may be set to between 0 volts and +4.5 volts), the right diffusion 104 (acting as drain, Vd) may be set to +5 volts, the gate (Vg) 120 may be set to −7 volts, and the substrate 102 (V, Vsub) may be set to 0 volts.

And, to erase the left bit 114L, Vs and Vd would be interchanged.

For example, to read the right bit 114R, using "reverse read", the right diffusion 104 (acting as source, Vs) is set to 0 volts the left diffusion 106 (acting as drain, Vd) is set to +2 volts the gate 120 (Vg) is set to +5 volts, and the substrate 102 (Vb, Vsub) is set to 0 volts.

And, to read the left bit 114L, Vs and Vd would be interchanged.

Commonly-owned US2007/0159880 and US 2007/0195607 disclose methods of operating NROM devices including programming and erasing, such as by Fowler Nordheim (−FN) electron tunneling from the top (gate), Hot Hole Injection (HHI) from the bottom (channel), Channel Hot Electron (CHE) injection from the bottom (channel), and Channel-Initiated Secondary Electron (CHISEL) injection from the bottom.

BE-SONOS

A structure which is similar to an NROM cell is a SONOS (silicon-oxide-nitride-oxide-silicon) cell, which also has an ONO stack disposed between the substrate and the gate structure (polysilicon).

FIG. 2A shows the structure of a BE (bandgap engineered) SONOS with ONO tunneling dielectric at the top, such as described in the article *A Novel Gate-Injection Program/Erase P-Channel NAND-Type Flash Memory with High (10M Cycle Endurance)*, Hang-Ting Lue et al., Macronix International Co. Ltd., 2007 Symposium on VLSI Technology Digest of Papers, 978-4-900784-03-1, pp 140-141, incorporated in its entirety by reference herein.

Programming is performed by −FN electron injection from the poly gate (from the top). The device is erased by +FN hole injection, also from the poly gate (from the top). ("FN" is an abbreviation for Fowler-Nordheim.)

The following table lists typical device parameters for the gate-injection BE-SONOS device.

| | |
|---|---|
| Tunneling Oxide (O3) | 1.3 nm |
| Inter Nitride (N2) | 2.1 nm |
| Inter Oxide (O2) | 1.7 nm |
| Trapping Nitride (N1) | 8.0 nm |
| Bottom Oxide (O1) | 6.0 nm |

FIG. 2B shows the structure of a BE (bandgap engineered) SONOS with ONO tunneling dielectric at the bottom, such as described in the article *BE-SONOS: A Bandgap Engineered SONOS with Excellent Performance and Reliability*, Hang-Ting Lue et al., Macronix International Co. Ltd., C) 2005, IEEE 0-7803-9269-8/05, incorporated in its entirety by reference herein.

For NOR, programming is performed by CHE (from the bottom) and is erased by −FN hole injection from the channel (from the bottom). For NAND programming is performed by +FN electron injection from the channel (from the bottom) and is erased by −FN hole injection from the channel (from the bottom)

The following table lists typical device parameters for the bottom-injection BE-SONOS device.

| | |
|---|---|
| Blocking Oxide (O3) | 9.0 nm |
| Trapping Nitride (N2) | 7.0 nm |
| Inter Oxide (O2) | 1.8 nm* |
| Inter Nitride (N1) | 2.0 nm |
| Bottom Oxide (O1) | 1.5 nm |

*The Inter Oxide (O2) may be 2.5 nm, see Reliability Model of Bandgap Engineered SONOS (BE-SONOS), Lue et al., MXIC IEDM, IEEE, 2006, incorporated in its entirety by reference herein.

Commonly-owned patents disclose structure and operation of NROM and related ONO memory cells. Some examples may be found in commonly-owned U.S. Pat. Nos. 5,768,192 and 6,011,725, 6,649,972 and 6,552,387.

Commonly-owned patents disclose architectural aspects of an NROM and related ONO array, (some of which have application to other types of NVM array) such as segmentation of the array to handle disruption in its operation, and symmetric architecture and non-symmetric architecture for specific products, as well as the use of NROM and other NVM array(s) related to a virtual ground array. Some examples may be found in commonly-owned U.S. Pat. Nos. 5,963,465, 6,285,574 and 6,633,496.

Commonly-owned patents also disclose additional aspects at the architecture level, including peripheral circuits that may be used to control an NROM array or the like. Some examples may be found in commonly-owned U.S. Pat. Nos. 6,233,180, and 6,448,750. See also commonly-owned U.S. Pat. No. 7,062,619.

Commonly-owned patents also disclose several methods of operation of NROM and similar arrays, such as algorithms related to programming, erasing, and/or reading such arrays. Some examples may be found in commonly-owned U.S. Pat. Nos. 6,215,148, 6,292,394 and 6,477,084.

Commonly-owned patents also disclose manufacturing processes, such as the process of forming a thin nitride layer that traps hot electrons as they are injected into the nitride layer. Some examples may be found in commonly-owned U.S. Pat. Nos. 5,966,603, 6,030,871, 6,133,095 and 6,583,007.

Commonly-owned patents also disclose algorithms and methods of operation for each segment or technological application, such as: fast programming methodologies in all flash memory segments, with particular focus on the data flash segment, smart programming algorithms in the code flash and EEPROM segments, and a single device containing a combination of data flash, code flash and/or EEPROM. Some examples may be found in commonly-owned U.S. Pat. Nos. 6,954,393 and 6,967,896.

Where applicable, descriptions involving NROM are intended specifically to include related oxide-nitride technologies, including SONOS (Silicon-Oxide-Nitride-Oxide-Silicon), MNOS (Metal-Nitride-Oxide-Silicon), MONOS (Metal-Oxide-Nitride-Oxide-Silicon), SANOS (Silicon-Aluminum Oxide-Nitride-Oxide-Silicon), MANOS (Metal-Aluminum Oxide-Nitride-Oxide-Silicon), and TANOS (Tantalum-Aluminum Oxide-Nitride-Oxide-Silicon), and the like used for NVM devices. Further description of NVM and related technologies may be found at "Non Volatile Memory Technology", Vol. 1 & 2 (2005), Vol. 3 (2006) and Vol. 4 (2007), published by Saifun Semiconductor; "Microchip Fabrication", by Peter Van Zant, $5^{th}$ Edition 2004; "Application-Specific Integrated Circuits" by Michael John Sebastian Smith, 1997; "Semiconductor and Electronic Devices", by Adir Bar-Lev, $2^{nd}$ Edition, 1999; "Digital Integrated Circuits" by Jan M. Rabaey, Anantha Chandrakasan and Borivoje Nikolic, $2^{nd}$ Edition, 2002 and materials presented at and through http://siliconnexus.com, "Design Considerations in Scaled SONOS Nonvolatile Memory Devices" found at: http://klabs.org/richcontent/MemoryContent/nvmt_symp/nvmts_2000/presentations/bu_white_s onos_lehigh_univ.pdf, "SONOS Nonvolatile Semiconductor Memories for Space and Military Applications" found at: http://klabs.org/richcontent/MemoryContent/nvmt_symp/nvmts_2000/papers/adams_d.pdf, "Philips Research—Technologies—Embedded Nonvolatile Memories" found at: http://www.research.philips.com/technologies/ics/nvmemories/ index.html, and "Semiconductor Memory: Non-Volatile Memory (NVM)" found at: http://www.ece.nus.edu.sg/stfpage/elezhucx/myweb/NVM.pdf,
all of which are incorporated by reference herein in their entirety.

BRIEF DESCRIPTION

Summary

This summary section of the patent application is intended to provide an overview of the subject matter disclosed herein, in a form lengthier than an "abstract", and should not be construed as limiting the invention to any features described in this summary section.

An NROM cell has an ONO (oxide-nitride-oxide) "charge-trapping" stack with a nitride (N) charge-trapping layer which is insulated by oxide (O) on both sides (top and bottom). In the main hereinafter, NROM will be discussed as an exemplary oxide-nitride NVM technology, but it should be clearly understood that the teachings disclosed herein may apply to other oxide-nitride ("ON") NVM technologies such as SANOS and TANOS which use a different oxide-based insulator (such as aluminum oxide) on one side of the nitride charge-trapping layer, and oxide on the other side. The charge-trapping stacks of SANOS and TANOS are oxide-nitride-aluminum oxide.

In a nonvolatile memory (NVM) cell, a crested barrier injector having one or more layers of material with a lower potential barrier for holes is disposed between a charge storage stack and a source of holes (the gate for top injection, the substrate for bottom injection), to facilitate hole tunneling from the source of holes into the charge-storage layer of the charge storage stack. The injector has a barrier potential for holes which is less than an insulating layer of the charge-storage stack which is oriented towards the source of holes. A multi-layer crested barrier injector may have layers of increasing potential barriers for holes from the source to the charge-storage layer. Methods of operating NVM cells are disclosed. The NVM cell may be NROM, SONOS, or other oxide-nitride technology NVM cells such as SANOS, MANOS, TANOS.

So as to avoid confusion between "injection source" and the source (S) diffusion of the NVM cell, the injection source (the gate for top injection, the substrate/channel for bottom injection) may be referred to as "emitter".

A number of nitride-based, crested barrier injectors having a lower potential barrier for holes than oxide will be described, such as nitride (SiN), silicon-rich nitride (SiRN), and oxynitride (SiON), but it should be clearly understood that the teachings disclosed herein may apply to materials other than nitride-based which have a lower potential barrier for holes than aluminum oxide (for example).

An exemplary crested barrier injector for NROM may comprise a layer of nitride (SiN) or silicon-rich nitride (SiRN). A layer of oxinitride (SiON) may be inserted between the layer of SiN or SiRN and the ONO stack, to reduce the amount of SiN or SiRN required, thereby minimizing undesirable charge-trapping in the injector.

Erase of the resulting NVM cell may be performed by hole tunneling, either from the top (from the gate) or the bottom (from the channel), and program may be performed (in both cases) by conventional electron injection (such as CHE, CHISEL) from the bottom (from the channel).

According to an embodiment of the disclosure, a nonvolatile memory (NVM) cell may comprise: a semiconductor substrate; a channel disposed between two diffusions in the substrate; a charge-storage stack disposed on the channel and comprising a charge-storage layer; a gate disposed above the charge-storage stack; and a crested barrier top injector disposed between the charge-storage stack and the gate. The crested barrier top injector may comprise a layer of a material having a potential barrier for holes which is lower than that of a top insulating layer of the charge-storage stack. The crested barrier top injector may comprise a layer of material having a valence band energy which is higher than that of a top insulating layer of the charge-storage stack.

The charge-storage stack may comprise a layer of nitride over a layer of oxide, and a top insulating layer disposed over the layer of nitride. The top insulating layer may comprise oxide; and the crested barrier top injector comprises a material selected from the group consisting of nitride (SiN), oxinitride (SiON), and silicon-rich nitride (SiRN).

The crested barrier top injector may comprise at least two layers of dielectric materials arranged such that a potential barrier height peak for holes is near a top insulating layer of the charge-storage stack and decreases toward the gate.

The crested barrier top injector may comprise at least one layer of a material having a potential barrier for holes which is lower than that of a top insulating layer of the charge-storage stack; and the at least one layer of material may comprise: a first layer of material disposed next to the gate and having a first potential barrier for holes which is lower than that of a top insulating layer of the charge-storage stack; and a second layer of material disposed between the first layer of material and the top insulating layer of the charge-storage stack and having a second potential barrier for holes which is lower than that of the top insulating layer of the charge-storage stack and higher than that of the first layer of material. The first layer of material may be selected from the group consisting of nitride (SiN) and silicon-rich nitride (SiRN); and the second layer of material may comprise oxinitride (SiON).

The crested barrier top injector may comprise multiple layers of a dielectric material arranged such that a potential barrier height for holes is highest near the charge-storage stack and decreases toward the gate electrode.

The NVM cell may comprise an NROM cell; and the charge-storage stack may comprise an ONO stack.

According to an embodiment of the disclosure, a nonvolatile memory (NVM) cell may comprise: a semiconductor substrate; a channel disposed between two diffusions in the substrate; a charge-storage stack disposed above the channel; a gate disposed on the charge-storage stack; and a crested barrier bottom injector disposed between the charge-storage stack and the substrate. The crested barrier bottom injector may comprise a stack of dielectric materials arranged such that a potential barrier height peak for holes is near the charge-storage and decreases toward the channel. The crested barrier bottom injector may comprise at least one layer of a material having a potential barrier for holes which is lower than that of a bottom oxide of the charge-storage stack. The crested barrier bottom injector may comprise at least one layer of oxinitride (SiON). The at least one layer of material may comprise: a first layer of material disposed next to the substrate and having a first potential barrier for holes which is lower than that of a bottom oxide layer of the charge-storage stack; and a second layer of material disposed between the first layer of material and the bottom oxide layer of the charge-storage stack and having a second potential barrier for holes which is lower than that of the bottom oxide layer of the charge-storage stack and higher than that of the first layer of material. At least one of the first and second layers may comprise oxinitride. The NVM cell may comprise an NROM cell; and the charge-storage stack may comprise an ONO stack.

According to an embodiment of the disclosure, a nonvolatile memory (NVM) cell may comprise: a semiconductor substrate; a channel disposed between two diffusions in the substrate; an ONO stack disposed on the channel, wherein the ONO stack comprises a top oxide layer, a nitride charge-storage layer, and a bottom oxide layer; a gate disposed above the ONO stack; and a nitride-based injector layer disposed between the ONO stack and the gate, in direct contact with the gate. The nitride-based injector layer may comprise a material selected from the group consisting of nitride (SiN), and silicon-rich nitride (SiRN).

A layer of oxinitride may be disposed between the nitride-based injector layer and the ONO stack.

Various materials and dimensions (layer thicknesses) are disclosed herein. And, in some of the embodiments disclosed herein, the gate may comprise heavily P+ doped poly-silicon.

According to an embodiment of the disclosure, a method of operating an NVM cell having a substrate, a charge-storage stack and a gate, may comprise: programming using electron injection from the substrate; and erasing using hole tunneling from the gate. Erasing may be performed by: applying approximately +10 volts to the gate; and applying approximately −8 volts to the substrate. Erasing may be performed by applying a potential difference of 14-18 volts between the gate and the substrate. The electron injection may be selected from the group consisting of channel hot electron (CHE) injection and channel initiated secondary electron (CHISEL) injection. An injector may be provided between the charge-storage stack and the gate of the NVM cell. Erase may be performed by iterative applications of an erase pulse, followed by a delay, followed by an erase verify operation; and the injector may be sufficiently conductive to be able to substantially shed any charges trapped therein, within the time of the delay interval between the erase pulse and the erase verify operation. The injector may comprise silicon-rich nitride (SiRN).

According to an embodiment of the disclosure, a nonvolatile memory (NVM) cell may comprise: a charge-storage stack; and an injector for facilitating hole injection into a charge-storage layer of the charge-storage stack; wherein the injector is sufficiently conductive to be able to substantially shed any charges trapped therein, within the time of a delay interval between an erase pulse and erase verify. The injector may comprise silicon-rich nitride (SiRN). The injector may comprise a layer of a material having a potential barrier for holes which is lower than that of a top insulating layer of the charge-storage stack.

The techniques disclosed herein may be applicable to most NVM devices including, but not limited to, charge-trapping devices such as NROM (sometimes referred to as Nitride Read Only Memory), SONOS (Semiconductor Oxide Nitride Oxide Semiconductor; Silicon-Oxide-Nitride-Oxide-Silicon), SANOS (Silicon-Aluminum Oxide-Nitride-Oxide-Silicon), MANOS (Metal-Aluminum Oxide-Nitride-Oxide-Silicon), and TANOS (Tantalum-Aluminum Oxide-Nitride-Oxide-Silicon), and also to Floating Gate (FG) devices.

According to some embodiments of the present invention, there is provided a nonvolatile memory (NVM) cell including a charge-storage stack with a charge-storage layer, a channel and a gate. According to some embodiments of the present invention, either the channel or the gate may act as a hole source, which holes may be used as part of an erasing step of the NVM cell. An injector or hole injector may be disposed between the charge-storage stack and a hole source. According to some embodiments of the present invention, the stack may include a top insulator layer and/or a bottom insulator layer. The top and/or bottom insulator layers may be part of the stack's interface. The insulator layer may comprise oxide.

According to some embodiments of the present invention, the injector may be composed of a hole permissive layer, which hole permissive material may have a potential barrier for holes which is relatively lower than that of an interface of said charge-storage stack. The injector may comprise a layer of material having a valence band energy which is higher than that of an insulator layer of the charge-storage stack. The injector may be composed of a material selected from the group consisting of silicon-nitride (SiN), oxinitride (SiON), and silicon-rich nitride (SiRN).

According to some embodiments of the present invention, the charge storage/trapping layer may be composed of charge trapping type material such as silicon nitride. The NVM cell may be of a type selected from the group consisting of NROM, SONOS, SANOS, MANOS and TONOS. The injector may be disposed between the stack and the gate. Alternatively, the injector may be disposed between the stack and the channel.

According to some embodiments of the present invention, the injector may be composed of a hole permissive layer of gradated hole barrier material, which gradated hole barrier material has increasing hole-barrier properties moving away from the hole source. The gradated hole barrier material may be composed of at least two layers of dielectric materials arranged such that a potential barrier height peak for holes is near an interface between the injector and the stack.

According to some embodiments of the present invention, the injector may be composed of at least one layer of a hole permissive material having a potential barrier for holes which is lower than that of an interface of the charge storage stack. The hole permissive material may include a first layer of material disposed next to the hole source and having a first potential barrier for holes which is lower than that of an insulating layer of the charge storage stack. The hole permissive material may also include a second layer of material disposed between the first layer of material and the insulating layer of the charge storage stack and having a second potential barrier for holes which is lower than that of said insulating layer of the charge storage stack and higher than that of said first layer of material. The first layer of material may be selected from the group consisting of nitride (SiN) and silicon-rich nitride (SiRN). The second layer of material may be oxinitride (SiON).

According to some embodiments of the present invention the NVM cell may be programmed using electron injection and erased using hole tunneling from a hole source, which hole source may either be the gate or the channel. Erasing may be performed by applying a potential difference of 14-18 volts between the gate and the substrate. Erasing may be performed by applying approximately +10 volts to the gate and by applying approximately −8 volts to the substrate. Alternatively, erasing may be performed by applying approximately +10 volts to the substrate and by applying approximately −8 volts to the gate. Electron injection may be performed using a technique selected from the group consisting of channel hot electron (CHE) injection and channel initiated secondary electron (CHISEL) injection. Hole tunneling may be performed through an injector between the charge-storage stack and the hole source of the NVM cell.

GLOSSARY

Unless otherwise noted, or as may be evident from the context of their usage, any terms, abbreviations, acronyms or scientific symbols and notations used herein are to be given their ordinary meaning in the technical discipline to which the disclosure most nearly pertains. The following terms, abbreviations and acronyms may be used throughout the descriptions presented herein and should generally be given the following meaning unless contradicted or elaborated upon by other descriptions set forth herein. Some of the terms set forth below may be registered trademarks (®).

When glossary terms (such as abbreviations) are used in the description, no distinction should be made between the use of capital (uppercase) and lowercase letters. For example "ABC", "abc" and "Abc", or any other combination of upper and lower case letters with these 3 letters in the same order, should be considered to have the same meaning as one another, unless indicated or explicitly stated to be otherwise. The same commonality generally applies to glossary terms (such as abbreviations) which include subscripts, which may appear with or without subscripts, such as "$X_{yz}$" and "Xyz". Additionally, plurals of glossary terms may or may not include an apostrophe before the final "s"—for example, ABCs or ABC's.

Band Diagram: In solid-state physics of semiconductors, a band diagram is a diagram showing the variation in the valence band and conduction band edges versus some spatial dimension, often denoted x. The Fermi level is also usually indicated in the diagram. Sometimes the intrinsic Fermi energy, Ei, which is the Fermi level in the absence of doping, may be shown also. The work function and electron affinity are shown on some diagrams as well. These diagrams are useful in explaining the operation of many kinds of semiconductor devices.

Bit: The word "bit" is a shortening of the words "binary digit." A bit refers to a digit in the binary numeral system (base 2). A given bit is either a binary "1" or "0". For example, the number 1001011 is 7 bits long. That is the "mathematical" definition of "bit". In some cases, the actual (physical) left and right charge storage areas of a NROM cell are referred to as the left "bit" and the right "bit", even though they may store more than one binary bit (with MLC, each storage area can store at least two binary bits).

Cell: The term "cell" may be used to describe anything, such as a NVM cell, that can store one unit of analog data. This includes FG memory cells, and non-FG memory cells, such as NROM. See half cell.

Cell Well: The cell well is an area in the silicon substrate that is prepared for functioning as a transistor or memory cell device by doping with an electron acceptor material such as boron or indium (p, electron acceptors or holes) or with an electron donor material such as phosphorous or arsenic (m, electron donors). The depth of a cell well is defined by the depth of the dopant distribution.

CHE: Short for channel hot electron. CHE is an "injection mechanism" for injecting electrons into a charge storage area of an NVM memory cell.

CHEI: Short for channel hot electron injection. sometimes abbreviated "CHE".

CHISEL: Short for channel initiated secondary electron. See CHE.

CMOS: Short for complementary metal oxide semiconductor (or silicon). CMOS consists of n-channel and p-channel MOS transistors.

CVD: Short for chemical vapor deposition. CVD is a chemical process used to produce high-purity, high-performance solid materials. The process is often used in the semiconductor industry to produce thin films. In a typical CVD process, the wafer (substrate) is exposed to one or more volatile precursors, which react and/or decompose on the substrate surface to produce the desired deposit. CVD is used to deposit materials in various forms, including: monocrystalline, polycrystalline, amorphous, and epitaxial. These materials include: silicon, oxide, nitride and metals, such as are commonly used in semiconductor fabrication.

Deposition: Deposition generally refers to the process of applying a material over another material (or the substrate).

Dielectric: A dielectric is a non-conducting material or substance. (A dielectric is an electrical insulator.) Some dielectrics commonly used in semiconductor technology are $SiO_2$ ("oxide") and $Si_3N_4$ ("nitride"). The insulating quality of a dielectric may be characterized by "k", the dielectric constant. Generally, the higher the "k", the better the insulating quality of the dielectric. Oxide, for example, has a k of approximately 3.9. A class of materials, referred to as "high-k" (or "high-K") dielectrics, have a dielectric constant higher than that of oxide (k>3.9).

Dielectric Constant: The relative dielectric constant of a material under given conditions is a measure of the extent to which it concentrates electrostatic lines of flux. Usually abbreviated "k", dielectric constant is the ratio of the amount of stored electrical energy when a potential is applied, relative to the permittivity of a vacuum. It is also called relative permittivity.

Doping: Doping is the process of introducing impurities (dopants) into the semiconductor substrate, or elements formed on the semiconductor substrate, and is often performed with a mask (or previously-formed elements in place) so that only certain areas of the substrate will be doped. For example, doping is used to form the source and drain regions of an FET. Usually in doping, a dopant, a dosage and an energy level are specified. For example, to form p-type regions, Boron can be implanted as a dose of between about $1E15/cm^2$ and about $5E15/cm^2$ at an energy level of between about 15 keV and about 150 keV to achieve a desired doping profile. An ion implanter is typically employed for the actual implantation. An inert carrier gas such as nitrogen is usually used to bring in the impurity source.

FET: Short for field effect transistor. The FET is a transistor that relies on an electric field to control the shape and hence the conductivity of a "channel" in a semiconductor material. FETs are sometimes used as voltage-controlled resistors. The terminals of FETs are called gate (G), drain (D) and source (S).

FN Tunneling Field Emission: Also called Fowler-Nordheim tunneling—is the process whereby electrons (or holes) tunnel through a barrier in the presence of a high electric field. This quantum mechanical tunneling process is an important mechanism for thin barriers such as those in metal-semiconductor junctions on highly-doped semiconductors.

Half Cell: "Half Cell" (or "half-cell") is a term which is sometimes used to refer to the two distinct charge storage areas (left and right "bits", or left and right "sides") of an NROM memory cell.

HHI: Short for hot hole injection. HHI is an "injection mechanism" for injecting holes into a charge storage area of an NVM memory cell. See CHE.

MLC: Short for multi-level cell. In the context of a floating gate (FG) memory cell, MLC means that at least two bits of information can be stored in the memory cell. In the context of an NROM memory cell, MLC means that at least four bits of information can be stored in the memory cell—at least two bits in each of the two charge storage areas (or half cells).

MOSFET: Short for metal oxide semiconductor (or silicon) field-effect transistor. MOSFET is by far the most common field-effect transistor in both digital and analog circuits. The MOSFET is composed of a channel of n-type or p-type semiconductor material, and is accordingly called an NMOSFET or a PMOSFET. (The 'metal' in the name is an anachronism from early chips where gates were metal; modern chips use polysilicon gates, but are still called MOSFETs).

Nitride: Commonly used to refer to silicon nitride (chemical formula $Si_3N_4$). A dielectric material commonly used in integrated circuit manufacturing. Forms an excellent mask (barrier) against oxidation of silicon (Si). Nitride is commonly used as a hard mask or, in the case of an NVM memory cell having an ONO layer, as a charge-trapping material. Silicon nitride may be abbreviated "SiN" or simply "N". "Silicon Rich" nitride, abbreviated "SiRN" or "SRN" refers to nitride, with increased Si content in the dielectric, such as $Si_7N_8$.

N-type: Semiconductor in which concentration of electrons is higher than the concentration of "holes". See p-type.

NROM: Short for nitride(d) read only memory. Generally, a FET-type device having a charge trapping medium such as a nitride layer for storing charges (electrons and holes) in two discrete areas, near the source and drain diffusions, respectively.

NVM: Short for non-volatile memory. NVM is computer memory that can retain the stored information even when not powered. Examples of non-volatile memory include read-only memory, flash memory, most types of magnetic computer storage devices (for example hard disks, floppy disk drives, and magnetic tape), optical disc drives, and early computer storage methods such as paper tape and punch cards. NVM includes floating gate (FG) devices and NROM devices, as well as devices using optical, magnetic and phase change properties of materials.

ONO: Short for oxide-nitride-oxide. ONO is used as a charge storage insulator consisting of a sandwich of thermally insulating oxide, and charge-trapping (or charge-storage) nitride.

Oxide: Commonly used to refer to silicon dioxide (SiO2). Also known as silica. SiO2 is the most common insulator in semiconductor device technology, particularly in silicon MOS/CMOS where it is used as a gate dielectric (gate oxide); high quality films may be obtained by thermal oxidation of silicon.

Oxinitride: Oxinitride (or oxynitride) refers to silicon OxiNitride (chemical formula $SiO_xN_y$, or simply SiON). Oxinitride is a mixture of silicon oxide and silicon nitride phase.

Poly: Short for polycrystalline silicon (Si), or "poly-Si". Heavily doped poly-Si is commonly used as a gate contact in silicon MOS and CMOS devices;

P-type: Semiconductor in which concentration of "holes" is higher than the concentration of electrons. See n-type. Examples of p-type silicon include silicon doped (enhanced) with boron (B), Indium (In) and the like. See n-type.

Program: A method to program a bit in an array, by applying a voltage scheme that injects electrons. This method causes an increase in the Vt of the bit that is being programmed. Alternatively, with "high Vt erase", programming may be a lowering of the Vt of the memory cell. See erase and read. Program may sometimes, erroneously be referred to as "write". See write.

Read: A method to read the digital data stored in the array. The read operation is usually performed in "blocks" of several cells. See erase and program.

Retention: Retention generally refers to the ability of a memory cell to retain charges inserted into the charge storage medium, such as a floating gate. The data retention of EPROM, EAROM, EEPROM, and Flash may be limited by charge leaking from the floating gates of the memory cell transistors. Leakage is exacerbated at high temperatures, by high applied voltages or in high-radiation environments.

SLC: Short for single level cell. In the context of a floating gate (FG) memory cell, SLC means that one bit of information can be stored in the memory cell. In the context of an NROM memory cell, SLC means that at least two bits of information can be stored in the memory cell. See MLC.

SONOS: Short for Si-Oxide-Nitride-Oxide-Si, another way to describe ONO with the Si substrate underneath and the Poly-Si gate on top.

Substrate: Typically a wafer, of monocrystalline silicon. A substrate is often covered by an oxide layer (sometimes referred to as a "pad oxide layer"). Pad oxide is usually relatively thin, e.g., in the range of about 50 to about 500 Angstroms (5-50 nm), and can be formed, for example, by thermal oxidation of the substrate.

TEHH: Short for Tunnel Enhanced Hot Hole injection. TEHH is an "injection mechanism". Also referred to as "band to band tunnel assisted hot hole injection".

Verify: A read operation after applying a program or erase pulse, that checks if the applied program or erase pulse moved the Vt to the target level (program-verify or erase-verify level)

BRIEF DESCRIPTION OF THE DRAWING(S)

Reference will be made in detail to embodiments of the disclosure, examples of which may be illustrated in the accompanying drawing figures (FIGs). The figures are intended to be illustrative, not limiting. Although the disclosure is generally described in the context of these embodiments, it should be understood that it is not intended to limit the disclosure to these particular embodiments.

Certain elements in selected ones of the figures may be illustrated not-to-scale, for illustrative clarity. The cross-sectional views, if any, presented herein may be in the form of "slices", or "near-sighted" cross-sectional views, omitting certain background lines which would otherwise be visible in a true cross-sectional view, for illustrative clarity. In some cases, hidden lines may be drawn as dashed lines (this is conventional), but in other cases they may be drawn as solid lines.

If shading or cross-hatching is used, it is intended to be of use in distinguishing one element from another (such as a cross-hatched element from a neighboring un-shaded element. It should be understood that it is not intended to limit the disclosure due to shading or cross-hatching in the drawing figures.

Elements of the figures may (or may not) be numbered as follows. The most significant digits (hundreds) of the reference number correspond to the figure number. For example, elements of FIG. 1 are typically numbered in the range of 100-199, and elements of FIG. 2 are typically numbered in the range of 200-299. Similar elements throughout the figures may be referred to by similar reference numerals. For example, the element 199 in FIG. 1 may be similar (and possibly identical) to the element 299 in FIG. 2. Throughout the figures, each of a plurality of elements 199 may be referred to individually as 199*a*, 199*b*, 199*c*, etc. Such relationships, if any, between similar elements in the same or different figures will become apparent throughout the specification, including, if applicable, in the claims and abstract.

FIG. 5 is a band diagram of an NVM cell, according to an embodiment of the disclosure.

FIG. 6 is a band diagram of an NVM cell, according to an embodiment of the disclosure.

DETAILED DESCRIPTION

Figure 1:
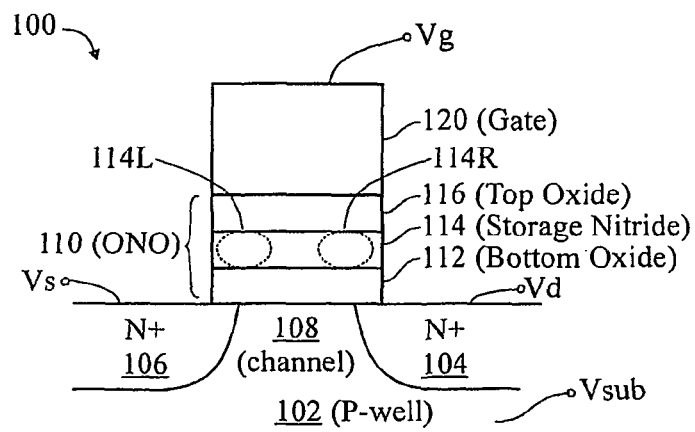
FIG. 1 is a cross-sectional view of an NROM cell of the prior art.

In the following description, various aspects of techniques related to the structure and operation of nitride read only memory (NROM) and other oxide-nitride technology NVM cells such as ONO (oxide-nitride-oxide) cells will be described. For the purpose of explanation, specific configurations and details are set forth in order to provide a thorough understanding of the techniques. However, it will also be apparent to one skilled in the art that the techniques may be practiced without specific details being presented herein. Furthermore, well-known features may be omitted or simplified in order not to obscure the description(s) of the techniques.

Throughout the descriptions set forth in this disclosure, lowercase numbers or letters may be used, instead of subscripts. For example Vg could be written Vg. Generally, lowercase is preferred to maintain uniform font size.) Regarding the use of subscripts (in the drawings, as well as throughout the text of this document), sometimes a character (letter or numeral) is written as a subscript—smaller, and lower than the character (typically a letter) preceding it, such as "$V_s$" (source voltage) or "$H_2O$" (water). For consistency of font size, such acronyms may be written in regular font, without subscripting, using uppercase and lowercase—for example "Vs" and "H2O". Superscripts may be designated using a carat—for example, $2^{30}$ may be written as "2^30". When powers of 10 are involved, the following notation may be used—for example, "2e13" means $2 \times 10^{13}$.

Acronyms or abbreviations may be pluralized by adding an "s" at the end, either with or without an apostrophe—for example "Esecs" or "Esec's", both being a plural form of the singular "Esec".

Although various features of the disclosure may be described in the context of a single embodiment, the features may also be provided separately or in any suitable combination. Conversely, although the disclosure may be described herein in the context of separate embodiments for clarity, the disclosure may also be implemented in a single embodiment. Furthermore, it should be understood that the disclosure can be carried out or practiced in various ways, and that the disclosure can be implemented in embodiments other than the exemplary ones described herein below. The descriptions, examples, methods and materials presented in the in the description, as well as in the claims, should not be construed as limiting, but rather as illustrative.

Terms for indicating relative direction or location, such as "up" and "down", "top" and "bottom", and the like may also be used, without limitation.

NVM Cells With Crested Barrier, Top Injector

NROM cells may typically use Hot Hole Injection (HHI) for erase, and channel hot electron (CHE) or channel-initiated secondary electron (CHISEL) injection for program. It is a general, object of this disclosure is to replace the HHI erase mechanism with a hole injection into the nitride storage in a uniform way, using a tunnelling mechanism, which may manifest itself across the entire ONO dielectric, not only at the edges next to junctions (diffusions).

Recently, the reliability of the NROM was investigated and a new unified retention theory was proposed to explain the retention after cycling characteristics. It was suggested that lateral charge redistribution inside the nitride layer and hot carrier induced interface states formation coexist. See Shapira et al., Unified Retention Model for localized charge-trapping nonvolatile memory device, Appl. Phys, Lett. 92, 133514 (2008), incorporated in its entirety by reference herein.

According to the disclosure, generally, in an NROM cell or other NVM cell having a nitride storage layer (such as SONOS, TANOS, MANOS, and the like), an erase operation may be performed by hole tunneling using a crested barrier injector having one layer or multiple layers.

In some top injector embodiments, the crested barrier injector is disposed between the storage stack (ONO in the case of an NROM cell) and the poly (poly-silicon) gate, and holes are injected into the storage nitride from the poly gate. In some bottom injector embodiments, the crested barrier injector is disposed between the storage stack and the silicon substrate (or channel), and holes are injected into the storage nitride from the substrate.

The crested barrier injector comprises one or more materials having a potential barrier for holes, which is lower than that of the top insulating layer cladding the nitride storage layer (top oxide in the case of an NROM cell) or the bottom insulating layer cladding the nitride storage layer (bottom oxide in the case of an NROM cell).

According to some reference sources, oxide has a barrier height for holes of approximately 4.7 eV (electron volts). This quantity may be more (such as 4.9 eV) or less (such as 4.4 eV), but the number 4.7 will be used in the main, hereinafter. See *Material Issues for Layered Tunnel Barrier Structures*, Casperon et al., Journal of Applied Physics, Vol 92, Nr. 1, July 2002, incorporated in its entirety by reference herein. For example, as set forth in Table 1 therein (a few illustrative values are reproduced herein):

| material | VB offset from Si (eV) |
| --- | --- |
| Aluminum Oxide (Al$_2$O$_3$) | 4.9 |
| Oxide (SiO$_2$)* | 4.4 |
| Hafnium oxide | 3.4 |
| Zirconium oxide | 3.3 |
| Nitride (Si$_3$N$_4$)* | 1.8 |

*for oxide, the value 4.7 will be used in the descriptions set forth herein
*for nitride, the value 1.7 will be used in the descriptions set forth herein Generally, a material with a valence band energy higher than that of oxide will exhibit a lower potential barrier (or lower offset) for holes than that of oxide. In the main, hereinafter, the potential barrier for holes will be discussed. It should be understood that the potential barriers for various materials set forth herein may be approximate, and may be used to illustrate that one material (such as SiON) may have a lower potential than that of another material (such as oxide). The numbers for potential barriers of materials set forth herein should not be taken to limit the scope of the disclosure.

Single Layer, Top Injector

Figure 3:
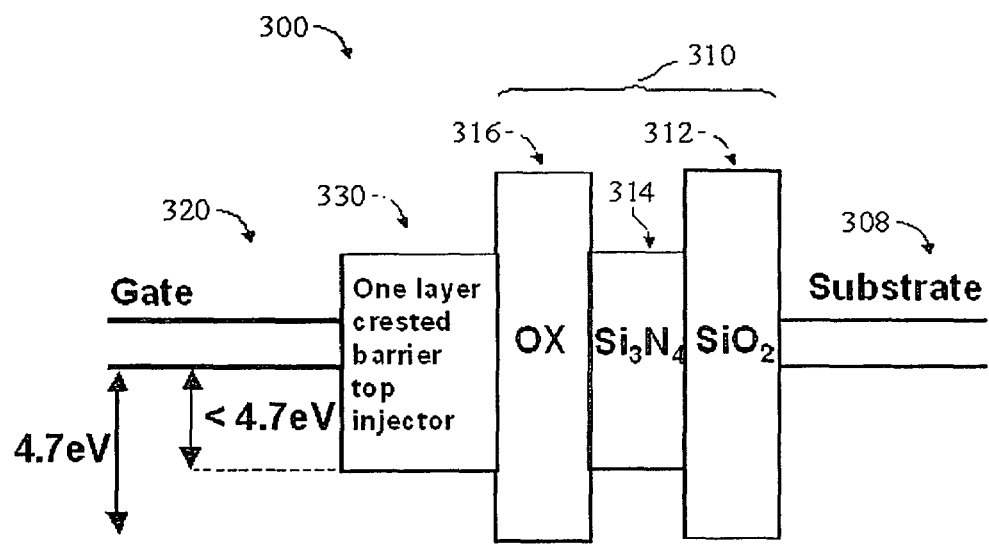
FIG. 3 is a band diagram of an NVM cell, according to an embodiment of the disclosure.

FIG. 3 is a band diagram illustrating a NVM cell 300 having a charge-storage stack 310 disposed between a semiconductor substrate 302 and a gate electrode 320, and a one-layer (single layer), crested barrier, "top" injector 330 disposed between the charge-storage stack 310 and the gate electrode (or "gate") 320.

The charge-storage stack 310 may be disposed above a channel (see for example FIG. 1, channel 108) in the substrate 302, and the channel may be disposed between two diffusions (see for example FIG. 1, diffusions 104 and 106) in the substrate 308. In an NROM cell, the charge-storage stack would be ONO (see for example FIG. 1, ONO stack 110).

In this example, the substrate 308 may be silicon and the gate electrode 320 may be poly-silicon. A bottom insulating layer 312 of the charge-storage stack 310 may be oxide (SiO$_2$). A charge-storage layer 314 of the charge-storage stack 310 may be nitride (Si$_3$N$_4$). A top insulating layer 316 of the charge-storage stack 310 may be oxide (SiO$_2$, in the case of NROM or SONOS), or another insulating material (such as Al$_2$O$_3$, in the case of SANOS, MANOS, TANOS, and the like).

In the diagram, the horizontal axis represents position of elements in the NVM cell, from left-to-right, going from the gate electrode 320, to the top injector 330, to the top insulating layer 316 of the charge-storage stack 310, to the charge-storage layer 314 of the charge-storage stack 310, to the bottom insulating layer 312 of the charge-storage stack 310, to the substrate 308 (or channel).

In the diagram, the vertical axis represents band energy in electron volts (eV). The gate electrode 320 has a "baseline" potential barrier for holes which, for purposes of this discussion is zero. The top insulating layer 316 has a non-zero potential barrier for holes.

For illustrative purposes only, and without limitation, the diagram indicates that the potential barrier of the top insulating layer 316 is 4.7 eV, which is representative of silicon oxide (SiO$_2$). However, it should clearly be understood that the top insulating layer 316 could be other than silicon oxide (SiO2). Generally, the top insulating layer 316 may be an oxide of a material other than silicon, such as aluminum oxide (in the case of SANOS, MANOS, TANOS, and the like). Therefore, the top insulating layer 316 is thus labeled simply "X".

FIG. 3 illustrates a situation where injection of holes will be performed from the top—in other words, from the gate electrode 320 (functioning as "injection source") into the charge-storage layer 314. And, since the injector 330 is located on the gate electrode side of the charge-storage stack 310, atop the charge-storage stack 310, atop the top insulating layer 316 ("OX"), the injector 330 is referred to as a "top" injector. Since holes injected from the injection source (gate 320) pass through the top insulating layer 316 ("OX"), the top insulating layer 316 ("OX") may be considered to be part of the overall injector. However, for purposes of this discussion the top insulating layer 316 is considered to be part of the charge-storage stack 310, since this is its conventional role. In any case, this insulating layer ("OX") 316, is disposed on the side of the charge-storage layer 314 which is oriented towards the injection source 320 (for top injection, the gate).

The one layer, crested barrier top injector 330 comprises a material, typically a dielectric material, which exhibits a lower potential barrier for holes than that of the top insulating layer 316. For example, if the top insulating layer 316 is silicon oxide (SiO2), having a potential barrier of 4.7 eV, the injector 330 should comprise a material having a potential barrier of less than 4.7 eV. Or, more generally, that the injector has a lower potential barrier (for holes) than the insulating layer between the storage layer and the source of injection.

An alternative characterization of the crested barrier injector 330 may be that it has a higher valence band energy than that of the top insulating layer 316. Or, more generally, that the injector has a higher valence band energy than the insulating layer between the storage layer and the source of injection. In other words, for purposes of this discussion, lower potential barrier equates with higher valence band energy.

For purposes of this discussion, a "crested barrier injector" may comprise one or more layers of material disposed between the source of (hole) injection (in this example, the gate electrode 310) and the charge-storage layer 314, and the layers may be disposed in order of increasing (from the source of injection to the charge-storage layer) order of potential barrier for holes.

In other words, a crested barrier injector for holes may be disposed between the injection source (such as the gate, for top injection) and the insulating layer (such as top oxide, for NROM) which is over the storage layer (such as nitride, for NROM). If the injector is a single layer, the potential barrier of the material should be less than that of the insulating layer which is over the storage layer.

Examples of suitable materials for the one layer, crested barrier, top injector 330 include, but are not limited to:
nitride (Si3N4, or SiN), having a potential barrier for holes of approximately 1.7 eV
silicon-rich nitride (SiRN), having a potential barrier for holes of approximately 1.7 eV
oxynitride (SiON), having a potential barrier for holes of approximately 3.2 eV Note that all of these materials for the top injector 330 have a lower potential barrier for holes than the top insulating layer 316, therefore complying with the definition of increasing potential barrier for holes from the source of injection to the charge-storage layer.

Multi-Layer, Top Injector

Figure 4:
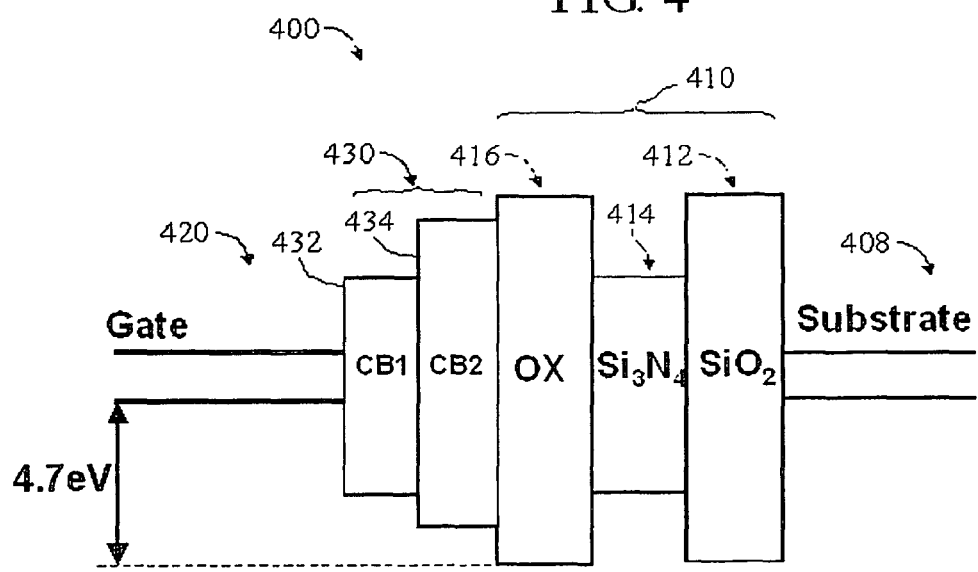
FIG. 4 is a band diagram of an NVM cell, according to an embodiment of the disclosure.

FIG. 4 is a band diagram illustrating a NVM cell 400 having a charge-storage stack 410 disposed between a semiconductor substrate 402 and a gate electrode 420, and a multi-layer, crested barrier, "top" injector 430 disposed between the charge-storage stack 310 and the gate electrode 420 (or "gate").

The charge-storage stack 410 may be disposed above a channel (see for example FIG. 1, channel 108) in the substrate 402, and the channel may be disposed between two diffusions (see for example FIG. 1, diffusions 104 and 106) in the substrate 408. In an NROM cell, the charge-storage stack would be ONO (see for example FIG. 1, ONO stack 110).

As mentioned above, a "crested barrier injector" may comprise one or more layers of material disposed between the source of (hole) injection (in this example, the gate electrode 410) and the charge-storage layer 414, and the layers may be disposed in order of increasing (from the source of injection to the charge-storage layer) order of potential barrier for holes.

In this example, the substrate 408 may be silicon and the gate electrode 420 may be poly-silicon. A bottom insulating layer 412 of the charge-storage stack 410 may be oxide ($SiO_2$). A charge-storage layer 414 of the charge-storage stack 410 may be nitride ($Si_3N_4$). A top insulating layer 416 of the charge-storage stack 410 may be oxide ($SiO_2$, in the case of NROM or SONOS), or another insulating material (such as $Al_2O_3$, in the case of SANOS, MANOS, TANOS, and the like).

In the diagram, the horizontal axis represents position of elements in the NVM cell, from left-to-right, going from the gate electrode 420, to the top injector 430, to the top insulating layer 416 of the charge-storage stack 410, to the charge-storage layer 414 of the charge-storage stack 410, to the bottom insulating layer 412 of the charge-storage stack 410, to the substrate 408 (or channel).

In the diagram, the vertical axis represents band energy in electron volts (eV). The gate electrode 420 has a "baseline" potential barrier for holes which, for purposes of this discussion is zero. The top insulating layer 416 has a non-zero potential barrier for holes.

For illustrative purposes only, and without limitation, the diagram indicates that the potential barrier of the top insulating layer is 4.7 eV, which is representative of silicon oxide ($SiO_2$). However, it should clearly be understood that the top insulating layer 416 could be other than silicon oxide (SiO2). Generally, the top insulating layer 416 may be an oxide of a material other than silicon, such as aluminum oxide (in the case of SANOS, MANOS, TANOS, and the like). Therefore, the top insulating layer 416 is thus labeled simply "OX".

FIG. 4 illustrates a situation where injection of holes will be performed from the top—in other words, from the gate electrode 420 (functioning as "injection source") into the charge-storage layer 414. And, since the injector 430 is located on the gate electrode side of the charge-storage stack 410, atop the charge-storage stack 410, atop the top insulating layer 416 ("OX"), the injector 430 is referred to as a "top" injector. Since holes injected from the injection source (gate 420) pass through the top insulating layer 416 ("OX"), the top insulating layer 416 ("OX") may be considered to be part of the overall injector. However, for purposes of this discussion the top insulating layer 416 is considered to be part of the charge-storage stack 410, since this is its conventional role. In any case, this insulating layer ("OX") 416, is disposed on the side of the charge-storage layer 414 which is oriented towards the injection source 420 (for top injection, the gate).

The multi-layer, crested barrier top injector 430 may comprise a first layer of material ("CB1") 432 disposed next to the injection source (gate 420) and having a first potential barrier height for holes which is less than that of the top insulating layer 416, followed by a next, second layer of material ("CB2") 434 disposed next to the top insulating layer 416 (in other words, between the first layer of material 432 and the top insulating layer 416) and having a second potential barrier height for holes which is less than that of the top insulating layer 416 but greater than that of the first layer 432.

In other words, a crested barrier injector for holes may be disposed between the injection source (such as the gate, for top injection) and the insulating layer (such as top oxide, for NROM) which is over the storage layer (such as nitride, for NROM). If the injector is multi-layer, the potential barrier of all of the layers should be less than that of the insulating layer which is over the storage layer and (in addition to which) starting from the injector source, each subsequent layer of the injector should have a potential barrier which is higher than the previous one.

A multi-layer top injector having two layers 432 and 434 may comprise a layer of nitride (SiN) or silicon-rich nitride (SiRN), disposed next to (towards) the poly gate 420 having a first potential barrier height for holes which is less than that of oxide (namely, top oxide 416), followed by a second layer of material 434 such as OxiNitride (SiON) disposed between the first layer material 432 and the top oxide 416 of the ONO stack, having a second potential barrier height for holes which is less than that of oxide but which may be greater than that of the first layer of material 432. It should be understood that the although the description of the layers proceeds (in words) from the gate "downward", in practice the layer 434 may be deposited before the layer 432.

A multi-layer, crested barrier, top injector may thus comprise a stack of two or more dielectric materials arranged such that a potential barrier height peak for holes is near the top (towards the injection source) layer of the charge-storage stack and gradually decreases (or decrements in steps, layer-by-layer) toward the injection source (for top injector, the gate electrode). And, as mentioned hereinabove, for purposes of this discussion, lower potential barrier equates with higher valence band energy, which means that the injection layer (432) next to the injection source (for top injector, the gate electrode) may have the highest valence band energy, and the injection layer (434) next to the top (towards the injection source) insulating layer (416) of the charge-storage stack (410) may have the lowest valence band energy.

Examples of suitable materials for the multi-layer, crested barrier, top injector 430 include, but are not limited to:
nitride (Si3N4, or SiN), having a potential barrier for holes of approximately 1.7 eV
silicon-rich nitride (SiRN), having a potential barrier for holes of approximately 1.7 eV
oxynitride (SiON), having a potential barrier for holes of approximately 3.2 eV Note that all of these exemplary materials (SiN, SiRN, SiON) for the top injector 430 have a lower potential barrier for holes than the top insulating layer 416, therefore complying with the definition of increasing potential barrier for holes from the source of injection to the charge-storage layer.

For a kind of multi-layer crested barrier top injector, rather than having multiple distinct layers (such as 432 and 434), one or more layers of dielectric material having a gradient, such as from a lowest nitride concentration near the charge-storage stack to a highest nitride concentration toward the gate, may be inserted so that the potential barrier height peak for holes is highest (yet lower than that of oxide) near the charge-storage stack and gradually decreases toward the gate electrode.

Performing an erase operation by injection of holes into the charge-storage layer (314, 414) of the charge-storage stack (310, 410), using either the one layer crested barrier top injector of FIG. 3, or the multi-layer crested barrier top injector of FIG. 4, may be accomplished using hole tunneling, by applying (for example) 14-18 volts between the gate and the substrate (or well) of the NVM cell, for example by applying plus (+) 8-10 volts to the gate, and minus (−) 6-8 volts to the substrate. The gate may be heavily P+ doped poly-Si for better hole supply. Programming of the NVM cell may be performed using channel hot electron (CHE) or channel initiated secondary electron (CHISEL) injection.

It should be noted that the conditions for hole injection from the top (gate) may tend to also cause electron injection from the bottom (substrate), which may be referred to as "back tunneling". In order to minimize this "side effect", the bottom oxide 312 or 412 should be sufficiently thick, such as at least 3 nm, so that the hole tunneling (from the top) will prevail (dominate) over electron tunneling (from the bottom).

Single Layer, Bottom Injector

FIG. 5 is a band diagram illustrating a NVM cell 500 having a charge-storage stack 510 disposed between a semiconductor substrate ("channel") 508 and a gate electrode ("gate") 520, and a one-layer (single layer), crested barrier, "bottom" injector 530 disposed between the substrate 508 and the charge-storage stack 510.

The charge-storage stack 510 may be disposed above a channel (see for example FIG. 1, channel 108) in the substrate 508, and the channel may be disposed between two diffusions (see for example FIG. 1, diffusions 104 and 106) in the substrate 508. In an NROM cell, the charge-storage stack would be ONO (see for example FIG. 1, ONO stack 110).

In this example, the substrate 508 may be silicon and the gate electrode 520 may be poly-silicon. A bottom insulating layer 512 of the charge-storage stack 510 may be oxide ($SiO_2$). A charge-storage layer 514 of the charge-storage stack 510 may be nitride ($Si_3N_4$). A top insulating layer 516 of the charge-storage stack 510 may be oxide ($SiO_2$, in the case of NROM or SONOS), or another insulating material (such as $Al_2O_3$, in the case of SANOS, MANOS, TANOS, and the like).

It may be noted that the charge-storage stack 510 for this bottom injector may be the same as the charge-storage stack 310 for the top injector (FIG. 3).

In the diagram, the horizontal axis represents position of elements in the NVM cell, from left-to-right, going from the gate 520, to the top insulating layer 516 of the charge-storage stack 510, to the charge-storage layer 514 of the charge-storage stack 510, to the bottom insulating layer 512 of the charge-storage stack 510, to the substrate (or channel) 508.

In the diagram, the vertical axis represents band energy in electron volts (eV). The substrate 508 has a "baseline" potential barrier for holes which, for purposes of this discussion is zero. The bottom insulating layer 512 has a non-zero potential barrier for holes. The bottom insulating layer 512 will typically be silicon oxide ($SiO_2$), and the diagram indicates that the non-zero potential barrier of the bottom insulating layer 512 is 4.7 eV, which is representative of silicon oxide ($SiO_2$).

It should clearly be understood that the top insulating layer 516 could be other than silicon oxide (SiO2). Generally, the top insulating layer 516 may be an oxide of a material other than silicon, such as aluminum oxide (in the case of SANOS, MANOS, TANOS, and the like). Therefore, the top insulating layer 516 is thus labeled simply "OX".

FIG. 5 illustrates a situation where injection of holes will be performed from the bottom—in other words, from the substrate 508 (functioning as "injection source") into the charge-storage layer 514. And, since the injector 530 is located on the substrate side of the charge-storage stack 510, below the charge-storage stack 510 (and below the bottom insulating layer 512 thereof), the injector 330 is referred to as a "bottom" injector. Since holes injected from the injection source (substrate 508) pass through the bottom insulating layer 512, the bottom insulating layer 512 may be considered to be part of the overall injector. However, for purposes of this discussion the bottom insulating layer 512 is considered to be part of the charge-storage stack 510, since this is its conventional role.

The one layer, crested barrier bottom injector 530 comprises a material, typically a dielectric material, which exhibits a lower potential barrier for holes than that of the bottom insulating layer 512. For example, if the bottom insulating layer 512 is silicon oxide (SiO2), having a potential barrier of 4.7 eV, the injector 530 should comprise a material having a potential barrier of less than 4.7 eV. Or, more generally, that the injector has a lower potential barrier (for holes) than the insulting layer between the storage layer and the source of injection.

An alternative characterization of the crested barrier injector 530 may be that it has a higher valence band energy than that of the bottom insulating layer 512. Or, more generally, that the injector has a higher valence band energy than the insulating layer between the storage layer and the source of injection. In other words, for purposes of this discussion, lower potential barrier equates with higher valence band energy.

For purposes of this discussion, a "crested barrier injector" may comprise one or more layers of material disposed between the source of (hole) injection (in this example, the substrate 508) and the charge-storage layer 514, and the layers may be disposed in order of increasing (from the source of injection to the charge-storage layer) order of potential barrier for holes.

In other words, a crested barrier injector for holes may be disposed between the injection source (such as the substrate, for bottom injection) and the insulating layer (such as bottom oxide, for NROM) which is under the storage layer (such as nitride, for NROM). If the injector is a single layer, the potential barrier of the material should be less than that of the insulating layer which is under the storage layer. Examples of suitable materials for the crested barrier top injector include:

oxynitride (SiON), having a potential barrier for holes of approximately 3.2 eV oxynitride (SiON), having a potential barrier for holes greater or less than 3.2 eV nitride (SiN) or silicon-rich nitride (SiRN), having a potential barrier for holes of approximately 1.7 eV but nitride tends to exhibit a poor interface with silicon, unless it is very thin.

Note that all of these materials for the bottom injector 530 have a lower potential barrier for holes than the bottom insulating layer 512, therefore complying with the definition of increasing potential barrier for holes from the source of injection to the charge-storage layer.

Multi-Layer, Bottom Injector

FIG. 6 is a band diagram illustrating a NVM cell 600 having a charge-storage stack 610 disposed between a semiconductor substrate 608 and a gate electrode ("gate") 620, and a multi-layer, crested barrier, "bottom" injector 630 disposed between the substrate 608 and the charge-storage stack 610 and the gate electrode ("gate") 320.

The charge-storage stack 610 may be disposed above a channel (see for example FIG. 1, channel 108) in the substrate 608, and the channel may be disposed between two diffusions (see for example FIG. 1, diffusions 104 and 106) in the substrate 608. In an NROM cell, the charge-storage stack would be ONO (see for example FIG. 1, ONO stack 110).

As mentioned above, a "crested barrier injector" may comprise one or more layers of material disposed between the source of (hole) injection (in this example, the substrate 608) and the charge-storage layer 614, and the layers may be disposed in order of increasing (from the source of injection to the charge-storage layer) order of potential barrier for holes.

In this example, the substrate 608 may be silicon and the gate electrode 620 may be poly-silicon. A bottom insulating layer 612 of the charge-storage stack 610 may be oxide ($SiO_2$). A charge-storage layer 614 of the charge-storage stack 610 may be nitride ($Si_3N_4$). A top insulating layer 616 of the charge-storage stack 610 may be oxide ($SiO_2$, in the case of NROM or SONOS), or another insulating material (such as $Al_2O_3$, in the case of SANOS, MANOS, TANOS, and the like).

It may be noted that the charge-storage stack 610 for this bottom injector may be the same as the charge-storage stack 410 for the top injector (FIG. 4).

In the diagram, the horizontal axis represents position of elements in the NVM cell, from left-to-right, going from the gate 620, to the top insulating layer 616 of the charge-storage stack 610, to the charge-storage layer 614 of the charge-storage stack 610, to the bottom insulating layer 612 of the charge-storage stack 610, to the substrate (or channel) 608.

In the diagram, the vertical axis represents band energy in electron volts (eV). The substrate 608 has a "baseline" potential barrier for holes which, for purposes of this discussion is zero. The bottom insulating layer 612 will typically be silicon oxide ($SiO_2$), and the diagram indicates that the non-zero potential barrier of the bottom insulating layer 612 is 4.7 eV, which is representative of silicon oxide ($SiO_2$).

It should clearly be understood that the top insulating layer 616 could be other than silicon oxide (SiO2). Generally, the top insulating layer 616 may be an oxide of a material other than silicon, such as aluminum oxide (in the case of SANOS, MANOS, TANOS, and the like). Therefore, the top insulating layer 616 is thus labeled simply "OX".

FIG. 6 illustrates a situation where injection of holes will be performed from the bottom—in other words, from the substrate 608 (functioning as "injection source") into the charge-storage layer 614. And, since the injector 630 is located on the substrate side of the charge-storage stack 610, below the charge-storage stack 610 (and below the bottom insulating layer 612 thereof), the injector 630 is referred to as a "bottom" injector. Since holes injected from the injection source (substrate 608) pass through the bottom insulating layer 612, the bottom insulating layer 612 may be considered to be part of the overall injector. However, for purposes of this discussion the bottom insulating layer 612 is considered to be part of the charge-storage stack 610, since this is its conventional role.

The multi-layer, crested barrier bottom injector 630 may comprise a first layer of material ("CB1") 632 disposed next to the injection source (substrate 608) and having a first potential barrier height for holes which is less than that of the bottom insulating layer 612, followed by a next, second layer of material ("CB2") 634 disposed next to the bottom insulating layer 612 (in other words, between the first layer of material 632 and the bottom insulating layer 612) and having a second potential barrier height for holes which is less than that of the bottom insulating layer 612 but greater than that of the first layer 632.

In other words, a crested barrier injector for holes may be disposed between the injection source (such as the substrate, for bottom injection) and the insulating layer (such as bottom oxide, for NROM) which is under the storage layer (such as nitride, for NROM). If the injector is multi-layer, the potential barrier of all of the layers should be less than that of the insulating layer which is under the storage layer and (in addition to which) starting from the injector source, each subsequent layer of the injector should have a potential barrier which is higher than the previous one.

A multi-layer bottom injector having two layers 632 and 634 may comprise a first layer of material 632 such oxinitride (SiON, which has a "nominal" potential barrier for holes of approximately 3.2 eV) disposed next to (towards) the substrate (channel) 608 having a first potential barrier height for holes which is less than that of oxide (namely, bottom oxide 612), followed by a second layer of material 634 such as SiON but with lower nitride concentration (and higher potential barrier) than the first layer of material 632 disposed between the first layer of material 632 and the bottom oxide 612 of the charge-storage stack 610, having a second potential barrier height for holes which is less than that of oxide but which may be greater than that of the first layer of material 632. In practice, the layer 632 may be deposited before the layer 634.

A multi-layer, crested barrier, bottom injector may thus comprise a stack of two or more dielectric materials arranged such that a potential barrier height peak for holes is near the bottom (towards the injection source) layer of the charge-storage stack and gradually decreases (or decrements in steps, layer-by-layer) toward the injection source (for bottom injector, the substrate). And, as mentioned hereinabove, for purposes of this discussion, lower potential barrier equates with higher valence band energy, which means that the injection layer (632) next to the injection source (for bottom injector, the substrate electrode) may have the highest valence band energy, and the injection layer (634) next to the bottom (towards the injection source) insulating layer (612) of the charge-storage stack (610) may have the lowest valence band energy.

Examples of suitable materials for the multi-layer, crested barrier, bottom injector 630 include, but are not limited to:

oxynitride (SiON), having a potential barrier for holes of approximately 3.2 eV oxinitride (SiON), having a potential barrier for holes of greater or less than 3.2 eV Whatever materials are used for the bottom injector 630 should have a lower potential barrier for holes than the bottom insulating layer 612, therefore complying with the definition of increasing potential barrier for holes from the source of injection to the charge-storage layer.

For a kind of multi-layer crested barrier bottom injector, rather than having multiple distinct layers (such as 632 and 634), one or more layers of dielectric material having a gradient, such as from a lowest nitride concentration near the charge-storage stack to a highest nitride concentration toward the substrate, may be inserted so that the potential barrier height peak for holes is highest (yet lower than that of oxide) near the charge-storage stack and gradually (rather than stepwise) decreases toward the substrate.

Performing an erase operation by injection of holes into the charge-storage layer (514, 614) of the charge-storage stack (510, 610), using either the one layer crested barrier bottom injector of FIG. 5, or the multi-layer crested barrier bottom injector of FIG. 6, may be accomplished using hole tunneling, by applying (for example) (−) 14-18 volts between the gate and the substrate (or well) of the NVM cell, for example by applying minus (−) 8-10 volts to the gate, and plus (+) 6-8 volts to the substrate. The gate may be heavily P+ doped poly-Si to suppress electron supply from the gate. Programming may be performed using channel hot electron (CHE) or channel initiated secondary electron (CHISEL) injection.

It should be noted that the conditions for hole injection from the bottom (substrate) may tend to also cause electron injection from the top (gate), which may be referred to as "back tunneling". In order to minimize this "side effect", the top oxide 516 or 616 should be sufficiently thick, such as at least 3 nm, so that the hole tunneling (from the bottom) will prevail (dominate) over electron tunneling (from the top).

Regarding the injectors described herein, whether top or bottom, the injector (330, 430, 530, 630) facilitates hole injection into a charge-storage layer (314, 414, 514, 614) of the charge-storage stack (310, 410, 510, 610). Silicon rich nitride (SiRN) is exemplary of an injector material that, although it may retain (trap) charges, is sufficiently conductive to be able to substantially shed any charges trapped therein, within the time of a delay interval between an erase pulse and erase verify (read) operation, so as not to skew the verify (read) operation.

Figure 7A:
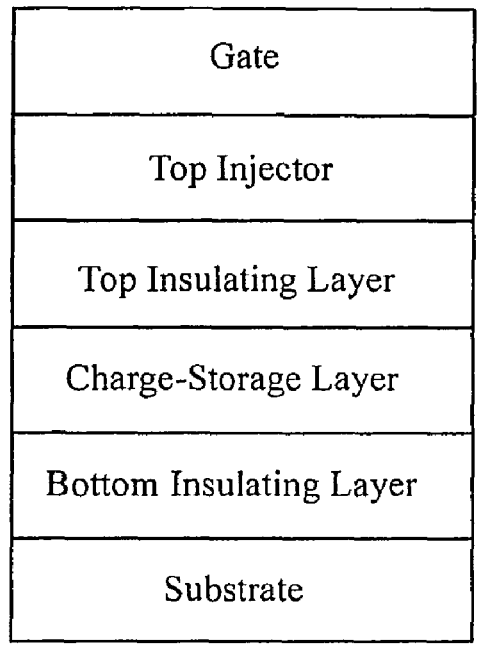
FIG. 7A is a cross-sectional view of an NVM cell, according to an embodiment of the disclosure.
Figure 7B:
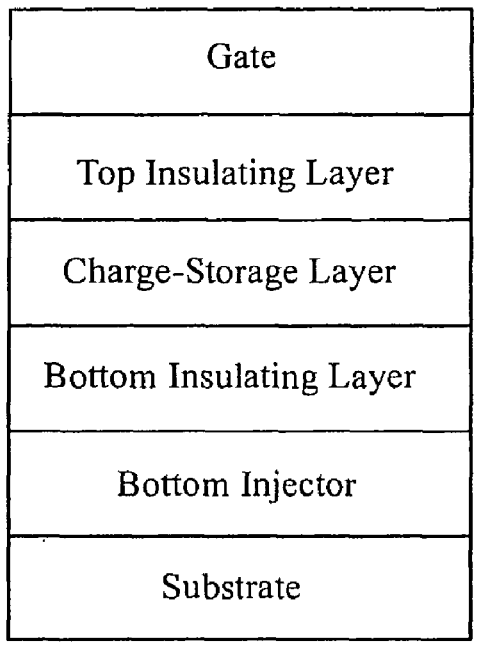
FIG. 7B is a cross-sectional view of an NVM cell, according to an embodiment of the disclosure.

FIG. 7A illustrates an NVM cell with a crested barrier top injector for top (from the gate) injection of holes into the charge-storage layer, and FIG. 7B illustrates an NVM cell with a crested barrier injector for bottom (from the substrate) injection of holes into the charge-storage layer. The charge-storage layer is insulated from the substrate by a bottom insulating layer, and is insulated from the gate by a top insulating layer.

In FIG. 7A, the top injector comprises one or more layers of material having a lower potential barrier (or higher valence band energy) for holes than the top insulating layer, and holes may be injected from the gate, through the top insulating layer, into the charge-storage layer for performing an erase operation. Electrons may be injected into the charge-storage layer from the substrate for performing a program operation.

In FIG. 7B, the bottom injector comprises one or more layers of material having a lower potential barrier (or higher valence band energy) for holes than the bottom insulating layer, and holes may be injected from the substrate into the charge-storage layer for performing an erase operation. Electrons may be injected into the charge-storage layer from the substrate for performing a program operation.

Some Embodiments of NROM with Crested Barrier, Top Injector

Four embodiments (#1, #2, #3, #4) of NROM cells with crested barrier, top injector will be described. The NROM cells described herein may be used in Flash memory. The NROM cells described herein may be referred to as "Gate Erase NROM". The techniques described herein may be referred to as "NVM Top Gate Injection", and may be applied to other ONO-based NVM cell, such as SONOS.

In addition the N+ poly-Si may be interchanged with heavily P+ doped poly-Si for better hole supply.

Generally, in each of the NROM cells described herein, crested barrier, top injector comprises at least one nitride-based injector layer which is be disposed (inserted) on top of the ONO stack, between the top oxide layer of the ONO stack and the (poly) gate of an NROM cell. The nitride-based injector may be provided in such a way that the good behaviour of the NROM cell is maintained substantially intact. The "barrier" injector is added to enhance the hole injection.

The top injector may comprise a layer of conventional nitride (SiN) or silicon-rich nitride (SiRN). Either SiN or SiRN provides a lower potential barrier for holes (than the top oxide layer of the ONO stack), and thereby may increase hole tunneling through to the nitride storage layer of the NROM, thereby enabling an efficient erase operation.

When using such a top injector, atop the top oxide layer of the ONO stack, the top oxide layer of the ONO stack may be considered to be part of the injector, although it generally may not be referred to as such, rather referring only to the additional layers as the "injector".

In crested barrier manufacturing, there is a difficulty in producing "trap-free" tunnel dielectrics. In other words, a nitride-based injector such as SiN or SiRN may trap charge, which may adversely affect the overall operation of the NROM cell, such as by biasing measured Vt during an erase verify. (Particularly in NROM cells having two charge-storage areas, incorporating a nitride-based injector that retains charge can alter results during measuring Vt of the cell, or half cell, particularly if the injector performs in a uniform way, across the entire ONO dielectric. In other words, it is not desirable that the injector retain charge.) However, since SiRN is more conductive than SiN, any trapped charge may escape more quickly, such as after an erase pulse, and before the erase verify pulse, thereby minimizing the problem. See, for example, *Nonvolatile Memory Technologies with Emphasis on Flash: A Comprehensive Guide to Understanding and Using Flash Memory Devices*, Edited by Joe E. Brewer. *IEEE Press Series on Microelectronic Systems*, Wiley, 2007 pp 437-438, incorporated in its entirety by reference herein.

The nitride-based injector may additionally (in addition to a layer of SiN or SIRN) comprise a layer of silicon oxinitride (SiON, may also be spelled oxynitride) disposed (inserted) between the SiN or SiRN layer and the top oxide layer of the NROM cell. (The SiON layer may also be an injector layer.) Generally, the purpose of the SiON layer is to reduce the thickness of the SiN or SiRN layer, thereby reducing charge-trapping within the SiN or SiRN layer of the injector, without adversely affecting hole tunneling efficiency. For example, layers of SiN (or SiRN) and SiON may be inserted between the poly-Si gate and the top oxide of the ONO stack of the NROM cell.

Crested Barrier Injector

A crested barrier may reduce band offset and modulate hole-tunneling current. Reference is made to *Layered tunnel barriers for nonvolatile memory devices*, Lilcharev, Appl. Phys. Lett., Vol 73, No. 15, October 1998, incorporated in its entirety by reference herein.

Band offset is essentially the same as potential barrier. It is the difference between the energy valence band of two materials. For a top injector it is the difference between poly gate and injector material. Reducing the band offset means to reduce the potential barrier or in other words to choose material with valence band energy closer to that of poly. Generally, every dielectric material with valence band energy higher than that of oxide will see barrier for holes smaller than that of oxide 4.7 eV (4.5-4.8 eV).

A one layer crested barrier injector may comprise a material with a lower potential barrier (than the oxide layer) for holes. Nitride (SiN) is an example of such a material. Also, silicon-rich nitride (SiRN). Also oxinitride (SiON), although SiON may be less useful as a one layer crested barrier injector due to its lower nitride content.

Generally, every dielectric material with valence band energy higher than that of oxide will exhibit a potential barrier for holes which is smaller than that of oxide (4.5-4.8 eV, typically 4.7 eV), for example:

nitride (SiN), 1.7 eV
silicon rich nitride (SiRN), 1.7 eV
oxinitride (SiON), 3.2 eV A multilayer crested barrier injector may comprise a multilayer stack of dielectric materials inserted between the ONO stack and the gate, such that the potential barrier height peak for holes is highest (yet lower than that of oxide) near the ONO, and gradually decreases toward the gate, in the case of top injector.

A multilayer crested barrier injector may comprise a multilayer stack of dielectric materials inserted between the ONO stack and the substrate (channel), such that the potential barrier height peak for holes is highest (yet lower than that of oxide) near the ONO, and gradually decreases toward the channel (substrate), in the case of bottom injector.

Compensating in the ONO Stack for the Addition of an Injector

Adding a nitride-based injector (whether one layer, or two, or more) on top of the top oxide layer of the ONO stack can alter the electrical characteristic of the ONO stack. Therefore, the top oxide layer of the ONO stack may be thinned, to compensate for the addition of the nitride-based injector, in order to try to maintain an electrical characteristic, such as a "dielectric constant-based electrical thickness" of layer(s) atop the storage nitride of the ONO stack substantially the same as in the ONO stack for a conventional NROM cell. However, the top oxide layer of the ONO stack should be at least 3 nm thick, to provide adequate insulation atop the nitride storage layer.

The following dielectric constants (k) are exemplary of the materials discussed herein:

| Oxide | SiO2 | k = 3.9 (2.4 to 4.2) |
|---|---|---|
| Nitride | Si3N4 | k = 7.8 (7.5 to 8.0) |
| Silicon-Rich Nitride | SiRN | k = 7.8 (7.5 to 8.0) |
| Oxynitride | SiON | k = 5.8 (4.2 to 7.5) |

Erase of the NROM cells disclosed herein may be performed by hole tunneling from the gate (from above) through the nitride-based injector. Programming of the NROM cells disclosed herein may be performed by conventional electron injection from the channel (from below), such as by using channel hot electron (CHE) or channel-initiated secondary electron (CHISEL) injection. Due to the self-aligned hole-tunneling erase, the mismatch between holes and electrons may be reduced which suppresses the charge redistribution problem. Additionally, Hot Hole Injection, which is considered as a main interface states formation mechanism is eliminated.

Four exemplary embodiments of NROM Cell With Crested Barrier, Top Injector, which may be referred to as Structures, #1 through #4, will be described below, and may be contrasted with a "standard", conventional NROM cell, such as has been shown and described with respect to FIG. 1. The following table lists typical device parameters for the standard NROM and Structures, #1 through #4 (top injectors).

Note, in the table above, that for the structures (#1-#4) with top injectors, the top oxide layer of the ONO stack may be thinned to compensate for electrical effects of the overlying injector, in contrast with the "standard NROM" cell, but the storage nitride and bottom oxide layers of the ONO stack may remain the same as the standard NROM cell.

NROM memory cells may typically be erased using a technique called hot hole injection (HHI), or tunnel enhanced hot hole (TEHH) injection, through the bottom oxide layer of the ONO stack. Some exemplary advantages of the tunneling techniques disclosed herein, as contrasted with HHI or TEHH injection may include:

scaling and reliability issues and problems are reduced, in comparison with HHI.

less damage to the bottom oxide layer of the ONO stack.

Generally, higher voltages but less current may be required to perform erase (as contrasted with HHI).

It should be understood that by applying a high electric field across the NROM cells that are described herein, such as 14V-18V from the gate to the substrate, either electron injection from silicon or hole injection from poly may be achieved. However, it should be understood that, in any structure where there is silicon (or polysilicon) and oxide, the electron injection is much more efficient by tunnelling because the barrier height between silicon (or polysilicon), relative to electron injection is about 3.1 eV-3.2 eV, and for hole injection is about 4.5-4.8 eV. Therefore, electrons may inject more easily, and accounts for previous techniques of performing −FN tunneling from the gate to increase the Vt of the storage nitride layer.

According to the present disclosure, various structures, mechanisms and techniques for performing hole injection, from the gate to decrease the Vt of the storage layer, efficiently and effectively, using tunneling, and engineered barriers. In conjunction with using hole injection from the top (from the gate) for erase, programming may be performed using conventional electron injection from the bottom (from the channel). Although it is possible to reverse the situation and use hole injection from the top (from the gate) for programming, in conjunction with using electron injection from the bottom (from the channel) for erase, in the main hereinafter hole injection is discussed in terms of an erase mechanism. Hole injection may be enhanced to become the dominant mechanism, hence the result will be erase rather than programming.

|  | Standard NROM | Structure #1 Nitride injector | Structure #2 SiRN injector | Structure #3 Nitride/SiON injector | Structure #4 SiRN/SiON injector |
|---|---|---|---|---|---|
| Gate | Poly N+ | Poly P+ | Poly P+ | Poly P+ | Poly P+ |
| Injector Nitride | -none- | 8 nm (5-14) | 8 nm (5-14) | 5 nm (3-9) | 5 nm (3-9) |
| Injector Oxynitride | -none- | -none- | -none- | 3 nm (2-5) | 3 nm (2-5) |
| Top Oxide | 12 nm* | 8 nm (5-10) | 8 nm (5-10) | 8 nm (5-10) | 8 nm (5-10) |
| Storage Nitride | 4 nm* | 4 nm* | 4 nm* | 4 nm* | 4 nm* |
| Bottom Oxide | 4 nm* | 4 nm* | 4 nm* | 4 nm* | 4 nm* |
| Well |  |  |  |  |  |

*top oxide of ONO stack may be 5-15 nm, such as 12 nm
*storage nitride of ONO stack may be 3-8 nm, such as 4 nm
*bottom oxide of ONO stack may be 3-6 nm, such as 4 nm
*Injector oxinitride may be 2-5 nm, such as 3 nm
*Injector nitride may be 5-14 nm, such as 8 nm

Embodiment #1

Figure 8:
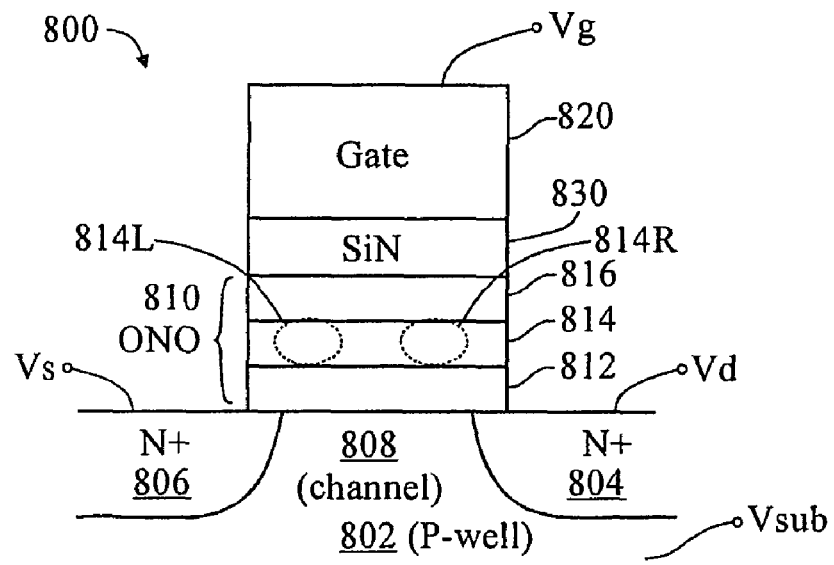
FIG. 8 is a cross-sectional view of an NROM cell, according to an embodiment of the disclosure.

FIG. 8 shows an embodiment of an NROM cell 800 with a crested barrier, top injector. A layer of silicon nitride (SiN, or simply "nitride") is inserted between the ONO stack and the gate of the NROM cell.

The NROM cell 800 is similar to the NROM cell 100 of FIG. 1, and comprises: a substrate 802 (compare 102);
two spaced-apart diffusions 804 and 806 (compare 104 and 106);
a channel between 808 (compare 108) disposed in the substrate 802, between the diffusions 804 and 806;
an ONO stack 810 (compare 110) disposed on a surface of the substrate 802, above the channel 808; and
a gate 820 (compare 120) disposed above the ONO stack 810.

The ONO stack 810 comprises a bottom oxide layer 812 (compare 112), a storage nitride layer 814 (compare 114), and a top oxide layer 816 (compare 116). The storage nitride layer has a left bit 114L and a right bit 114R. Exemplary approximate dimensions for the layers 812, 814 and 816 of the ONO stack 810 are set forth in the table above, under "Structure #1".

Various voltages Vg, Vd, Vs and Vsub which may be applied to the gate 820, diffusions 804 and 806, and substrate (or P-well) 802 are shown, and may be discussed hereinbelow.

The NROM cell 800 further comprises a nitride-based, crested-barrier, top injector 830 disposed between the ONO stack 810 and the gate 820, more particularly between the top oxide layer 816 of the ONO stack and the gate 820. The nitride-based injector 830 may comprise a single layer conventional silicon nitride (SiN), having a stoichiometry of $Si_3N_4$ (3 parts silicon, 4 parts nitrogen), and may have a thickness of approximately 8 nm.

Figure 2A:
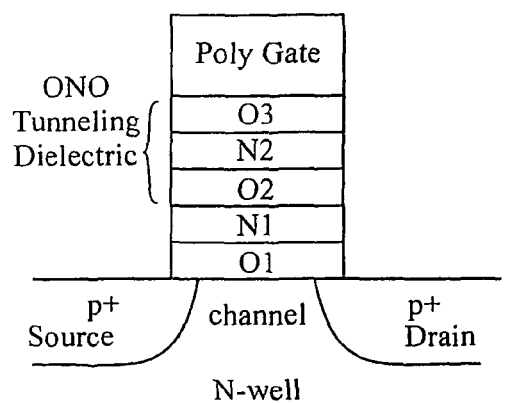
FIG. 2A is a cross-sectional view of a BE-SONOS cell of the prior art.
Figure 2B:
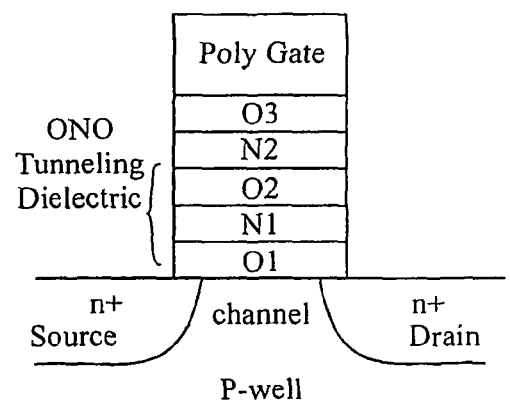
FIG. 2B is a cross-sectional view of a BE-SONOS cell of the prior art.

The nitride-based top injector 830 comprising nitride (SiN) may be in direct contact with the gate 820. For example, there is no oxide layer between the nitride-based injector 830 and the gate 820. Compare, for example, the BE-SONOS structure in FIG. 2A, where there is an oxide layer O3 between the N2 tunneling dielectric and the poly gate.

The nitride-based top injector 830 provides a lower barrier (lower than oxide) for hole tunneling, from the gate 820 (which may be polysilicon), through the top oxide layer 816 of the ONO stack 810, to the storage nitride layer 814 of the ONO stack 810, thus facilitating (such as enabling) the erase operation.

In order to compensate for the addition of the nitride-based top injector 830, the top oxide layer 816 of the ONO stack 810 may be thinner than in a conventional (or "standard") NROM (such as 100, FIG. 1). For example, whereas the top oxide layer 116 in a conventional NROM cell may be 12 nm, the top oxide layer 816 in the NROM cell 800 with a crested barrier, top injector may 8 nm.

In this embodiment (Structure #1), the nitride-based injector 830 comprises nitride (SiN), having a dielectric constant of approximately 7.8, or approximately twice that of oxide, which may be approximately 3.9. Using these exemplary numbers, it is evident that 8 nm of nitride has a "dielectric constant-based electrical thickness" equivalent to 8 nm×3.9/7.8=4 nm of oxide. Thus, 12 nm of oxide may be replaced by 4 nm "oxide equivalent" nm of nitride, plus 8 nm of oxide. In this manner, an electrical characteristic, such as a "dielectric constant-based electrical thickness" of layer(s) atop the storage nitride of the ONO stack may be maintained substantially the same as in the ONO stack for a conventional NROM cell, thereby preserving favorable operating characteristics of the NROM cell. However, the top oxide layer of the ONO stack should be at least 3 nm thick, to provide adequate insulation atop the nitride storage layer. As shown in the table, a top oxide having a thickness of 5-15 nm (such as 12 nm) may be "replaced" by 5-14 nm (such as 8 nm) of nitride injector in conjunction with a "thinned" top oxide having a thickness of 5-10 nm (such as 8 nm).

The thickness of the nitride storage layer 814 may be approximately 4 nm, or substantially unchanged from the conventional NROM. The thickness of the bottom oxide layer 812 may be approximately 4 nm, or substantially unchanged from the conventional NROM.

Programming of the NROM cell 800 may proceed as usual, inserting electrons into the left and right bits 814L and 814R of the charge storage layer 814, such as with CHE or CHISEL injection mechanisms.

To perform erase, by hole tunneling from the gate, the following voltages may be applied:
the gate voltage (Vg) may be approximately +10v
the diffusion voltages (Vs and Vd) may both be same as substrate or float
the substrate voltage (Vb or Vsub) may be approximately −8v Notice that both diffusions are biased the same, since the erase operation is for the entire cell (both half cells). Also notice that the potential difference between gate and substrate (or gate and well, $V_{GW}$) may be approximately 14-18 volts.

The gate 820 may be heavily P+ doped poly-Si to provide a better (than N+) hole supply. For example, boron (B) at a dose of 1e16/cm² at an energy level of 9 KeV, or BF2 at a dose of 1e16/cm² at an energy level of 40 KeV.

Embodiment #2

Figure 9:
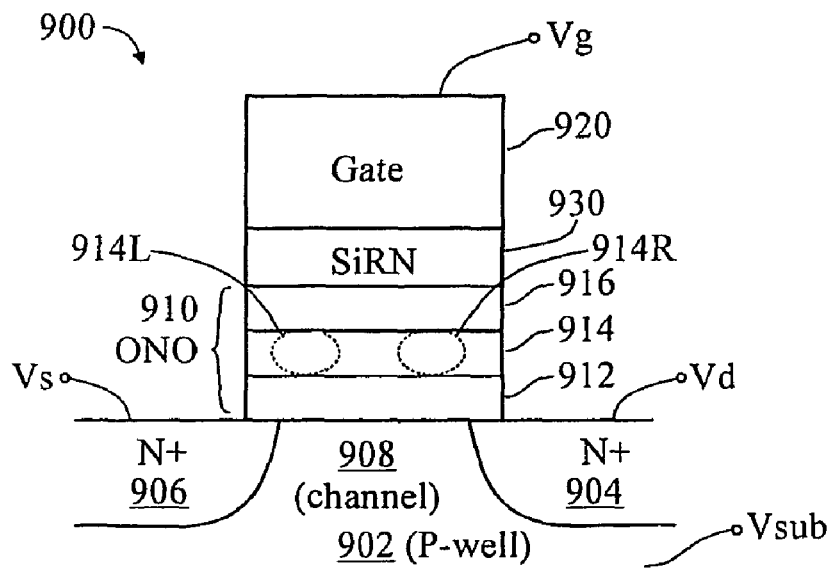
FIG. 9 is a cross-sectional view of an NROM cell, according to an embodiment of the disclosure.

FIG. 9 shows an embodiment of an NROM cell 900 with a crested barrier, top injector. This embodiment is similar to the embodiment of FIG. 8, but with Silicon-Rich Nitride (SiRN) substituted for conventional nitride (SiN).

The NROM cell 900 is similar to the NROM cell 100 of FIG. 1, and comprises:
a substrate 902 (compare 102);
two spaced-apart diffusions 904 and 906 (compare 104 and 106);
a channel between 908 (compare 108) disposed in the substrate 902, between the diffusions 904 and 906;
an ONO stack 910 (compare 110) disposed on a surface of the substrate 902, above the channel 908; and
a gate 920 (compare 120) disposed above the ONO stack 910.

The ONO stack 910 comprises a bottom oxide layer 912 (compare 112), a storage nitride layer 914 (compare 114), and a top oxide layer 916 (compare 116). The storage nitride layer has a left bit 114L and a right bit 114R. Exemplary approximate dimensions for the layers 912, 914 and 916 of the ONO stack 910 are set forth in the table above, under "Structure #2".

Various voltages Vg, Vd, Vs and Vsub which may be applied to the gate 920, diffusions 904 and 906, and substrate (or P-well) 902 are shown, and may be discussed hereinbelow.

The NROM cell 900 further comprises a nitride-based, crested-barrier, top injector 930 disposed between the ONO stack 910 and the gate 920, more particularly between the top oxide layer 916 of the ONO stack and the gate 920. The nitride-based injector 830 may comprise a single layer of silicon-rich nitride (SiRN), having a stoichiometry of $Si_xN_y$ (more than 3 parts silicon and/or fewer than 4 parts nitrogen), and may have a thickness of approximately 8 nm. A non-limiting example of SiRN is $Si_7N_8$ (7 parts silicon and 8 parts nitrogen).

The nitride-based injector 930 comprising nitride (SiRN) is shown in direct contact with the gate 920, but it need not be in direct contact. For example, an oxide layer could be inserted between the SiRN nitride-based injector 930 and the gate 920, in a manner similar to the BE-SONOS structure in FIG. 2A, where there is an oxide layer O3 between the N2 of the tunneling dielectric and the poly gate. However, note that with an oxide layer (not shown) between the SiRN and the gate, the resulting injector would not be "crested barrier", since the potential barrier does not increase from the poly gate to the top layer of ONO. Rather, it would increase (with the additional oxide, then decrease (with the SiRN), then increase again (with the top oxide layer of the ONO).

The nitride-based top injector 930 provides a lower barrier (lower than oxide) for hole tunneling, from the gate 920 (which may be polysilicon), through the top oxide layer 916 of the ONO stack 910, to the storage nitride layer 914 of the ONO stack 910, thus facilitating (such as enabling) the erase operation.

As charges such as holes tunnel through the injector layer(s), some may become trapped. Recall that nitride is used in the ONO stack, and is selected due to its ability to trap charges. However, it is generally not desirable that charges be trapped anywhere else other than in the storage nitride layer of the ONO stack. Typically, during an erase operation, a pulse is applied, resulting in injection of charges such as holes, via the injector (and top oxide layer) into the storage nitride, followed by a short delay, followed by a verify (read), and the process is repeated (iterated) a few times until an erase verify voltage (EV) is passed (or fails). Since SiRN is more conductive than SiN therefore charges (holes) trapped in it will escape more quickly than otherwise (with SiN). As a result, retention from the injector layer may be minimized. Some representative times for erase functions are:

Erase pulse, approximately 100 μs
Delay, approximately 1 μs
Verify, approximately 1 ns Therefore, according to an aspect of the disclosure, an injector layer (930) is provided between the ONO stack and the gate which is sufficiently conductive to be able to substantially shed (allow to escape) any charges trapped therein, within the time of a delay interval between an erase pulse and erase verify.

In order to compensate for the addition of the nitride-based top injector 930, the top oxide layer 916 of the ONO stack 910 may be thinner than in a conventional (or "standard") NROM (such as 100, FIG. 1). For example, whereas the top oxide layer 116 in a conventional NROM cell may be 12 nm, the top oxide layer 916 in the NROM cell 900 with a crested barrier, top injector may 8 nm.

In this embodiment (Structure #2), the nitride-based injector 930 comprises silicon-rich nitride (SiRN), having a dielectric constant of approximately 7.8, or approximately twice that of oxide, which may be approximately 3.9. Using these exemplary numbers, it is evident that 8 nm of silicon-rich nitride has a "dielectric constant-based electrical thickness" equivalent to 8 nm×3.9/7.8=4 nm of oxide. Thus, 12 nm of oxide may be replaced by 4 nm "oxide equivalent" nm of silicon-rich nitride, plus 8 nm of oxide. In this manner, an electrical characteristic, such as a "dielectric constant-based electrical thickness" of layer(s) atop the storage nitride of the ONO stack may be maintained substantially the same as in the ONO stack for a conventional NROM cell, thereby preserving favorable operating characteristics of the NROM cell. However, the top oxide layer of the ONO stack should be at least 3 nm thick, to provide adequate insulation atop the nitride storage layer. As shown in the table, a top oxide having a thickness of 5-15 nm (such as 12 nm) may be "replaced" by 5-14 nm (such as 8 nm) of nitride injector in conjunction with a "thinned" top oxide having a thickness of 5-10 nm (such as 8 nm).

The thickness of the nitride storage layer 914 may be approximately 4 nm, or substantially unchanged from the conventional NROM. The thickness of the bottom oxide layer 912 may be approximately 4 nm, or substantially unchanged from the standard NROM.

Programming of the NROM cell 900 may proceed as usual, inserting electrons into the left and right bits 914L and 914R of the charge storage layer 914, such as with CHE or CHISEL injection mechanisms.

To perform erase, by hole tunneling from the gate, the following voltages may be applied:

the gate voltage (Vg) may be approximately +10v
the diffusion voltages (Vs and Vd) may both be same as substrate or float
the substrate voltage (Vb or Vsub) may be approximately −8v Notice that both diffusions are biased the same, since the erase operation is for the entire cell (both half cells). Also notice that the potential difference between gate and substrate (or gate and well, $V_{GW}$) may be approximately 14-18 volts.

The gate 920 may be heavily P+ doped poly-Si to provide a better (than N+) hole supply. For example, boron (B) at a dose of 1e16/cm$^2$ at an energy level of 9 KeV, or BF$_2$ at a dose of 1e16/cm$^2$ at an energy level of 40 KeV.

Embodiment #3

Figure 10:
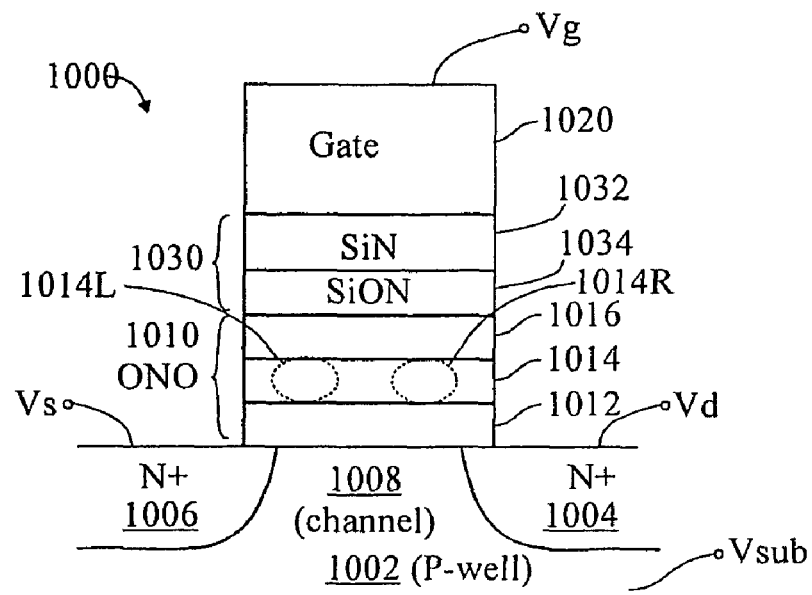
FIG. 10 is a cross-sectional view of an NROM cell, according to an embodiment of the disclosure.

FIG. 10 shows an embodiment of an NROM cell 1000 with a crested barrier, top injector. This embodiment is similar to the embodiment of FIG. 8, but with a layer of oxinitride (SiON) disposed between the nitride-based injector (SiN) and the top oxide layer of the ONO stack. The layer of oxinitride is considered to be part of the injector. (The top oxide layer of the ONO stack is also an "injector", but is not referred to as such.)

The NROM cell 800 is similar to the NROM cell 100 of FIG. 1, and comprises:
a substrate 1002 (compare 102);
two spaced-apart diffusions 1004 and 1006 (compare 104 and 106);
a channel between 1008 (compare 108) disposed in the substrate 1002, between the diffusions 1004 and 1006;
an ONO stack 1010 (compare 110) disposed on a surface of the substrate 1002, above the channel 1008; and
a gate 1020 (compare 120) disposed above the ONO stack 1010.

The ONO stack 1010 comprises a bottom oxide layer 1012 (compare 112), a storage nitride layer 1014 (compare 114), and a top oxide layer 1016 (compare 116). The storage nitride layer has a left bit 114L and a right bit 114R. Exemplary approximate dimensions for the layers 1012, 1014 and 1016 of the ONO stack 1010 are set forth in the table above, under "Structure #3".

Various voltages Vg, Vd, Vs and Vsub which may be applied to the gate 1020, diffusions 1004 and 1006, and substrate (or P-well) 1002 are shown, and may be discussed hereinbelow.

The NROM cell 1000 further comprises a multi-layer, nitride-based, crested-barrier, top injector 1030 disposed between the ONO stack 1010 and the gate 1020, more particularly between the top oxide layer 1016 of the ONO stack and the gate 1020.

The nitride-based injector 1030 may comprise a layer 1032 of conventional silicon nitride (SiN), having a stoichiometry of $Si_3N_4$ (3 parts silicon, 4 parts nitrogen), and may have a thickness of approximately 5 nm. The layer 1032 of silicon nitride (SiN) provides a lower potential barrier (lower than oxide) for hole tunneling, from the gate 520 (which may be polysilicon), through the top oxide layer 1016 of the ONO stack 1010, to the storage nitride layer 1014 of the ONO stack 1010, thus facilitating (such as enabling) the erase operation.

A layer of oxinitride (SiON) 1034 is disposed (inserted) between the layer 1032 of silicon nitride (SiN) and the top oxide layer 1016 of the ONO stack 1010, and may have a thickness of approximately 3 nm. The addition of the SiON layer 1034 reduces the amount of nitride (SiN) 1032 needed, and hence may reduce the amount of charge trapping inside the nitride layer 1032, without affecting the hole-tunneling efficiency.

The nitride layer 1032 may have a thickness of 5 nm, as contrasted with 8 nm for Embodiment #1. The SiON layer 540 also functions as an injector. Hence in this embodiment, there is a multi-layer injector (a layer 1032 of SiN over a layer 1034 of SiON). (Although, technically speaking, the top oxide layer 1016 of the ONO stack 1010 is also an injector, it is not generally referred to as such herein.)

In order to compensate for the addition of the nitride-based top injector 1030, comprising a layer 1032 of nitride (SiN) and a layer 1034 of oxinitride (SiON), the top oxide layer 1016 of the ONO stack 1010 may be thinner than in a conventional (or "standard") NROM (such as 100, FIG. 1). For example, whereas the top oxide layer 116 in a conventional NROM cell may be 12 nm, the top oxide layer 1016 in the NROM cell 1000 with a crested barrier, top injector may 8 nm.

In this embodiment (Structure #3), the nitride-based injector 1030 comprises a layer 1032 of nitride (SiN) having a dielectric constant of approximately 7.8, or approximately twice that of oxide, which may be approximately 3.9, plus a layer 1034 of oxinitride having a dielectric constant of approximately 5.8. Using these exemplary numbers, it is evident that 5 nm of nitride has a "dielectric constant-based electrical thickness" equivalent to 5 nm×3.9/7.8=2.5 nm of oxide, and 3 nm of SiON has a "dielectric constant-based electrical thickness" equivalent to 3 nm×3.9/5.8=2.0 nm of oxide. Thus, 12 nm of oxide may be replaced by 2.5 nm "oxide equivalent" nm of nitride, plus 2.0 nm "oxide equivalent" of oxinitride, plus 8 nm of oxide. In this manner, an electrical characteristic, such as a "dielectric constant-based electrical thickness" of layer(s) atop the storage nitride of the ONO stack may be maintained substantially the same as in the ONO stack for a conventional NROM cell, thereby preserving favorable operating characteristics of the NROM cell. However, the top oxide layer of the ONO stack should be at least 3 nm thick, to provide adequate insulation atop the nitride storage layer. As shown in the table, a top oxide having a thickness of 5-15 nm (such as 12 nm) may be "replaced" by 3-9 nm (such as 5 nm) of nitride injector plus 2-5 nm (such as 3 nm) of oxinitride injector in conjunction with a "thinned" top oxide having a thickness of 5-10 nm (such as 8 nm).

The thickness of the nitride storage layer 1014 may be approximately 4 nm, or substantially unchanged from the conventional NROM. The thickness of the bottom oxide layer 1012 may be approximately 4 nm, or substantially unchanged from the conventional NROM.

Programming of the NROM cell 1000 may proceed as usual, inserting electrons into the left and right bits 1014L and 1014R of the charge storage layer 1014, such as with CHE or CHISEL injection mechanisms.

To perform erase, by hole tunneling from the gate, the following voltages may be applied:
the gate voltage (Vg) may be approximately +10v
the diffusion voltages (Vs and Vd) may both be same as substrate or float
the substrate voltage (Vb or Vsub) may be approximately −8v Notice that both diffusions are biased the same, since the erase operation is for the entire cell (both half cells). Also notice that the potential difference between gate and substrate (or gate and well, $V_{GW}$) may be approximately 14-18 volts.

The gate 1020 may be heavily P+ doped poly-Si to provide a better (than N+) hole supply. For example, boron (B) at a dose of 1e16/cm² at an energy level of 9 KeV, or BF2 at a dose of 1e16/cm² at an energy level of 40 KeV.

Embodiment #4

Figure 11:
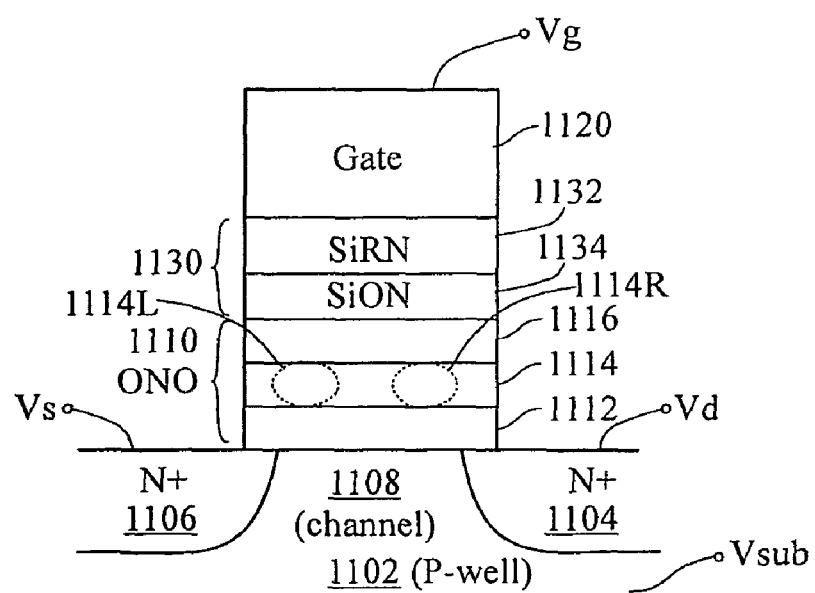
FIG. 11 is a cross-sectional view of an NROM cell, according to an embodiment of the disclosure.

FIG. 11 shows an embodiment of an NROM cell 1100 with a crested barrier, top injector. This embodiment is similar to the embodiment of FIG. 9, but with a layer of oxinitride (SiON) disposed between the nitride-based injector (SiRN) and the top oxide layer of the ONO stack. The layer of oxinitride is considered to be part of the injector. (The top oxide layer of the ONO stack is also an "injector", but is not referred to as such.)

The NROM cell 800 is similar to the NROM cell 100 of FIG. 1, and comprises:
a substrate 1102 (compare 102);
two spaced-apart diffusions 1104 and 1106 (compare 104 and 106);
a channel between 1108 (compare 108) disposed in the substrate 1102, between the diffusions 1104 and 1106;
an ONO stack 1110 (compare 110) disposed on a surface of the substrate 1102, above the channel 1108; and
a gate 1120 (compare 120) disposed above the ONO stack 1110.

The ONO stack 1110 comprises a bottom oxide layer 1112 (compare 112), a storage nitride layer 1114 (compare 114), and a top oxide layer 1116 (compare 116). The storage nitride layer has a left bit 114L and a right bit 114R. Exemplary approximate dimensions for the layers 1112, 1114 and 1116 of the ONO stack 1110 are set forth in the table above, under "Structure #4".

Various voltages Vg, Vd, Vs and Vsub which may be applied to the gate 1120, diffusions 1104 and 1106, and substrate (or P-well) 1102 are shown, and may be discussed hereinbelow.

The NROM cell 1100 further comprises a multi-layer, nitride-based, crested-barrier, top injector 1130 disposed between the ONO stack 1110 and the gate 1120, more particularly between the top oxide layer 1116 of the ONO stack and the gate 1120.

The nitride-based injector 1130 may comprise a layer 1132 of silicon-rich nitride (SiRN), having a stoichiometry of $Si_xN_y$ (more than 3 parts silicon and/or fewer than 4 parts nitrogen), and may have a thickness of approximately 5 nm. The layer 1132 of silicon-rich nitride (SiRN) provides a lower potential barrier (lower than oxide) for hole tunneling, from the gate 1120 (which may be polysilicon), through the top oxide layer 1116 of the ONO stack 1110, to the storage nitride layer 1114 of the ONO stack 1110, thus facilitating (such as enabling) the erase operation.

A layer of oxinitride (SiON) 1134 is disposed (inserted) between the layer 1132 of silicon-rich nitride (SiRN) and the top oxide layer 1116 of the ONO stack 1110, and may have a thickness of approximately 3 nm. The addition of the SiON layer 1134 reduces the amount of silicon-rich nitride (SiRN)

1132 needed, and hence may reduce the amount of charge trapping inside the silicon-rich nitride layer 1132, without affecting the hole-tunneling efficiency.

The silicon-rich nitride layer 1132 may have a thickness of 5 nm, as contrasted with 8 nm for Embodiment #2. The SiON layer 1132 also functions as an injector. Hence in this embodiment, there is a multi-layer injector (a layer 1132 of SiRN over a layer 1134 of SiON). (Although, technically speaking, the top oxide layer 1116 of the ONO stack 1110 is also an injector, it is not generally referred to as such herein.)

As charges such as holes tunnel through the injector layer(s), some may become trapped. Recall that nitride is used in the ONO stack, and is selected due to its ability to trap charges. However, it is generally not desirable that charges be trapped anywhere else other than in the storage nitride layer of the ONO stack. Typically, during an erase operation, a pulse is applied, resulting in injection of charges such as holes, via the injector (and top oxide layer) into the storage nitride, followed by a short delay, followed by a verify (read), and the process is repeated a few times until an erase verify voltage (EV) is passed (or fails). Since SiRN is more conductive than SiN therefore charges (holes) trapped in it will escape more quickly than otherwise (with SiN). As a result, retention from the injector layer may be minimized. Some representative times for erase functions are:

Erase pulse, approximately 100 µs
Delay, approximately 1 µs
Verify, approximately 1 ns Therefore, according to an aspect of the disclosure, an injector layer (1132) is provided between the ONO stack and the gate which is sufficiently conductive to be able to substantially shed (allow to escape) any charges trapped therein, within the time of a delay interval between an erase pulse and erase verify.

In order to compensate for the addition of the nitride-based top injector 1030, comprising a layer 1132 of silicon-rich nitride (SiRN) and a layer 1134 of oxinitride (SiON), the top oxide layer 1116 of the ONO stack 1110 may be thinner than in a conventional (or "standard") NROM (such as 100, FIG. 1). For example, whereas the top oxide layer 116 in a conventional NROM cell may be 12 nm, the top oxide layer 1116 in the NROM cell 1100 with a crested barrier, top injector may 8 nm.

In this embodiment (Structure #4), the nitride-based injector 1130 comprises a layer 1132 of silicon-rich nitride (SiRN) having a dielectric constant of approximately 7.8, or approximately twice that of oxide, which may be approximately 3.9, plus a layer 1034 of oxinitride having a dielectric constant of approximately 5.8. Using these exemplary numbers, it is evident that 5 nm of silicon-rich nitride has a "dielectric constant-based electrical thickness" equivalent to 5 nm×3.9/7.8=2.5 nm of oxide, and 3 nm of SiON has a "dielectric constant-based electrical thickness" equivalent to 3 nm×3.9/5.8=2.0 nm of oxide. Thus, 12 nm of oxide may be replaced by 2.5 nm "oxide equivalent" nm of silicon-rich nitride, plus 2.0 nm "oxide equivalent" of oxinitride, plus 8 nm of oxide. In this manner, an electrical characteristic, such as a "dielectric constant-based electrical thickness" of layer(s) atop the storage nitride of the ONO stack may be maintained substantially the same as in the ONO stack for a conventional NROM cell, thereby preserving favorable operating characteristics of the NROM cell. However, the top oxide layer of the ONO stack should be at least 3 nm thick, to provide adequate insulation atop the nitride storage layer. As shown in the table, a top oxide having a thickness of 5-15 nm (such as 12 nm) may be "replaced" by 3-9 nm (such as 5 nm) of silicon-rich nitride injector plus 2-5 nm (such as 3 nm) of oxinitride injector in conjunction with a "thinned" top oxide having a thickness of 5-10 nm (such as 8 nm).

The thickness of the nitride storage layer 1114 may be approximately 4 nm, or substantially unchanged from the conventional NROM. The thickness of the bottom oxide layer 1112 may be approximately 4 nm, or substantially unchanged from the conventional NROM.

Programming of the NROM cell 1100 may proceed as usual, inserting electrons into the left and right bits 1114L and 1114R of the charge storage layer 1114, such as with CHE or CHISEL injection mechanisms.

To perform erase, by hole tunneling from the gate, the following voltages may be applied:

the gate voltage (Vg) may be approximately +10v
the diffusion voltages (Vs and Vd) may both be same as substrate or float
the substrate voltage (Vb or Vsub) may be approximately −8v Notice that both diffusions are biased the same, since the erase operation is for the entire cell (both half cells). Also notice that the potential difference between gate and substrate (or gate and well, $V_{GW}$) may be approximately 14-18 volts.

The gate 1120 may be heavily P+ doped poly-Si to provide a better (than N+) hole supply. For example, boron (B) at a dose of 1e16/cm² at an energy level of 9 KeV, or BF2 at a dose of 1e16/cm² at an energy level of 40 KeV.

Band Diagram

Figure 12:
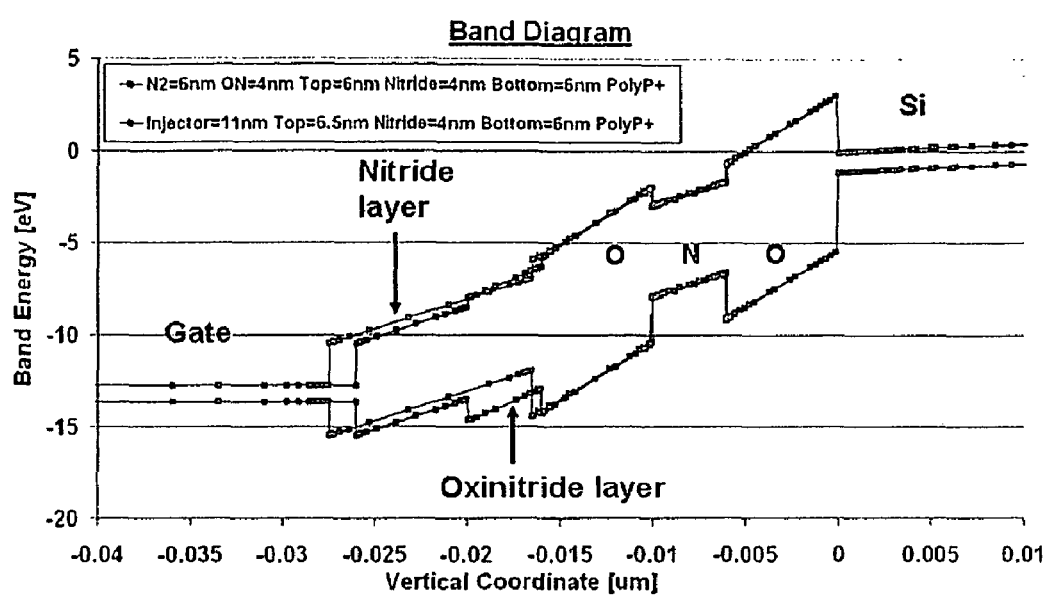
FIG. 12 is a band diagram, according to an embodiment of the disclosure.

FIG. 12 corresponds with page 94 of the provisional patent application, and shows a band diagram. The vertical axis is band energy in electron volts (eV). The horizontal axis is vertical coordinate, in micrometers (µm). (Note that 1 µm=1000 nm.) From left-to-right, band energies for the gate (poly), nitride layer, oxinitride layer, ONO layers and silicon are shown. As noted therein, Erase—tunneling through Nitride layer taking advantage of the Low Barrier height for holes. Nitride layer thickness is thick enough hence the Oxinitride and Top Oxide [of ONO] play no role in the hole tunneling Since the Oxinitride is lower barrier than Oxide it can be inserted (Structure #3) and by thus reduce the injector nitride thickness. The nitride in the injector is thick to make oxinitride transparent, and the oxinitride in the injector is thick to make top oxide transparent.

Two curves are presented, one relating to Structure #1 (single layer nitride injector), the other relating to Structure #3 (multilayer, nitride over oxinitride). The curves would be substantially the same for Structures #2 and #4 (SiRN instead of SiN).

NROM Cell With Crested Barrier, Bottom Injector

Hole injection may be performed from the bottom (from the substrate), rather than from the top (from the gate), and some bottom injectors were described with respect to FIGS. 5 and 6. Some embodiments are now described.

Embodiment #5

Figure 13A:
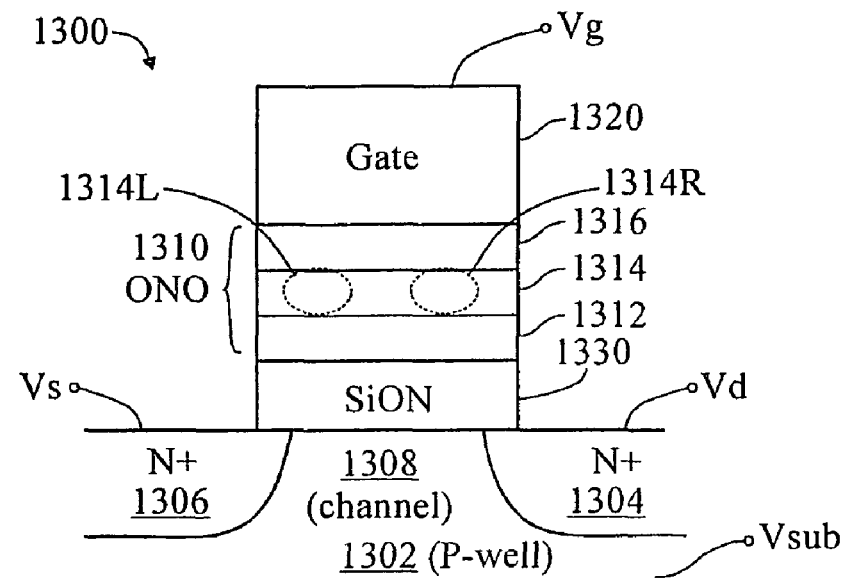
FIG. 13A is a cross-sectional view of an NROM cell, according to an embodiment of the disclosure.

FIG. 13A shows an embodiment of an NROM cell 1300 with a single layer, crested barrier, bottom injector.

The NROM cell 1300 is similar to the NROM cell 100 of FIG. 1, and comprises:
a substrate 1302 (compare 102);
two spaced-apart diffusions 1304 and 1306 (compare 104 and 106);
a channel between 1308 (compare 108) disposed in the substrate 1302, between the diffusions 1304 and 1306;
an ONO stack 1310 (compare 110) disposed on a surface of the substrate 1302, above the channel 1308; and a gate 1320 (compare 120) disposed above the ONO stack 1310.

The ONO stack 1310 comprises a bottom oxide layer 1312 (compare 112), a storage nitride layer 1314 (compare 114), and a top oxide layer 1316 (compare 116). The storage nitride layer has a left bit 114L and a right bit 114R.

Exemplary approximate dimensions for the layers 1312, 1314 and 1316 of the ONO stack 1310 may be:
bottom oxide layer 1312, approximately 3 nm (rather than 4 nm, because there is a bottom injector)
storage nitride layer 1314, approximately 4 nm (no change from standard NROM) top oxide layer 1316, approximately 12 nm (no change from standard NROM)

Various voltages Vg, Vd, Vs and Vsub which may be applied to the gate 1320, diffusions 1304 and 1306, and substrate (or P-well) 1302 are shown, and may be discussed hereinbelow.

The NROM cell 1300 further comprises a crested-barrier, bottom injector 1330 disposed between the ONO stack 1310 and the substrate 1302 (channel 1308), more particularly between the bottom oxide layer 1312 of the ONO stack 1310 and the substrate 1302. The crested-barrier, bottom injector 1330 may comprise a single layer of oxinitride (SiON), and may have a thickness of approximately 1.5 nm (1 nm-2 nm)

The oxinitride, crested-barrier, bottom injector 1330 provides a lower barrier (lower than oxide) for hole tunneling, from the silicon substrate 1302, through the bottom oxide layer 1316 of the ONO stack 1310, to the storage nitride layer 1314 of the ONO stack 1310, thus facilitating (such as enabling) the erase operation.

In order to compensate for the addition of the oxinitride bottom injector 1330, the bottom oxide layer 1312 of the ONO stack 1310 may be thinner than in a conventional (or "standard") NROM (such as 100, FIG. 1). For example, whereas the bottom oxide layer 112 in a conventional NROM cell may be approximately 4 nm, the bottom oxide layer 1312 in the NROM cell 1300 with a crested barrier, bottom injector may be approximately 3 nm. The thickness of the nitride storage layer 1314 may be approximately 4 nm, or substantially unchanged from the conventional NROM. The thickness of the top oxide layer 1312 may be approximately 12 nm, or substantially unchanged from the standard NROM.

Programming of the NROM cell 1300 may proceed as usual, inserting electrons into the left and right bits 1314L and 1314R of the charge storage layer 1314, such as with CHE or CHISEL injection mechanisms.

To perform erase, by hole tunneling from the substrate, the following voltages may be applied:
the gate voltage (Vg) may be approximately −10v
the diffusion voltages (Vs and Vd) may both be same as substrate or float
the substrate voltage (Vb or Vsub) may be approximately +8v Notice that both diffusions are biased the same, since the erase operation is for the entire cell (both half cells). Also notice that the potential difference between gate and substrate (or gate and well, $V_{GW}$) may be approximately (−) 14-18 volts.

The gate 1320 may be heavily P+ doped poly-Si to suppress electron supply from the poly (gate). When negative Vg is applied, both hole tunneling from silicon and electron tunneling from the poly are possible. In order to reduce the electron tunneling, P+ poly may be used instead of N+ poly. For example, boron (B) at a dose of 1e16/cm$^2$ at energy level of 9 KeV or BF2 at a dose of 1e16/cm$^2$ at an energy level of 40 KeV.

Embodiment #6

Figure 13B:
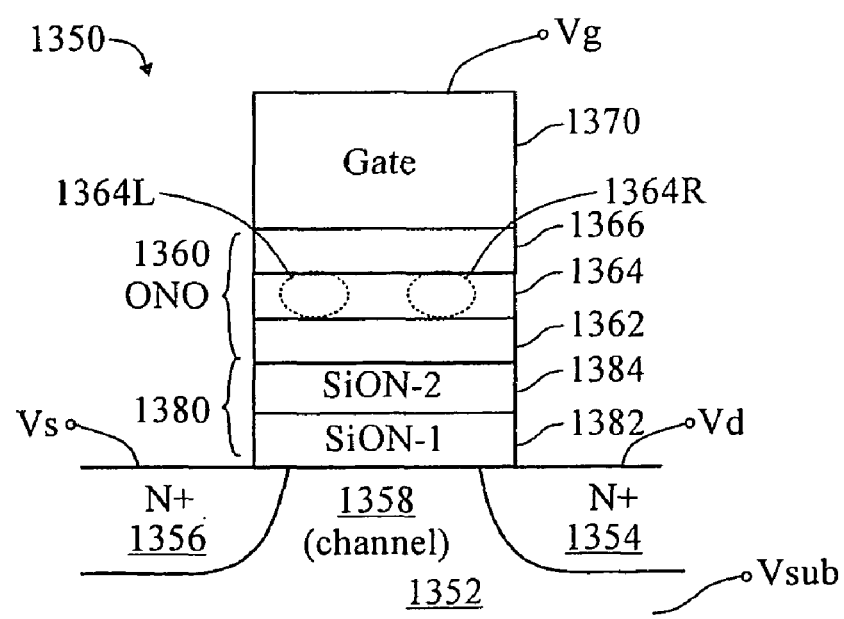
FIG. 13B is a cross-sectional view of an NROM cell, according to an embodiment of the disclosure.

FIG. 13B shows an embodiment of an NROM cell 1350 with a multi-layer, crested barrier, bottom injector.

The NROM cell 1350 is similar to the NROM cell 100 of FIG. 1, and comprises:
a substrate 1352 (compare 102);
two spaced-apart diffusions 1354 and 1356 (compare 104 and 106);
a channel between 1358 (compare 108) disposed in the substrate 1352, between the diffusions 1354 and 1356;
an ONO stack 1360 (compare 110) disposed on a surface of the substrate 1352, above the channel 1358; and
a gate 1370 (compare 120) disposed above the ONO stack 1360.

The ONO stack 1360 comprises a bottom oxide layer 1362 (compare 112), a storage nitride layer 1364 (compare 114), and a top oxide layer 1366 (compare 116). The storage nitride layer has a left bit 114L and a right bit 114R.

Exemplary approximate dimensions for the layers 1362, 1364 and 1366 of the ONO stack 1360 may be:
bottom oxide layer 1362, approximately 3 nm (rather than 4 nm, because there is a bottom injector)
storage nitride layer 1364, approximately 4 nm (no change from standard NROM) top oxide layer 1366, approximately 12 nm (no change from standard NROM)

Various voltages Vg, Vd, Vs and Vsub which may be applied to the gate 1370, diffusions 1354 and 1356, and substrate (or P-well) 1352 are shown, and may be discussed hereinbelow.

The NROM cell 1350 further comprises a crested-barrier, bottom injector 1330 disposed between the ONO stack 1360 and the substrate 1352 (channel 1358), more particularly between the bottom oxide layer 1362 of the ONO stack 1360 and the substrate 1352. The crested-barrier, bottom injector 1330 may comprise a multiple layers of dielectric material, such as oxinitride (SiON), and may have a thickness of approximately 1.5 nm (1 nm-2 nm).

For example, the multi-layer crested barrier 1380 may comprise a first layer of material, such as a first SiON ("SiON-1") 1382 disposed next to the injection source (substrate 1358) and having a first potential barrier height for holes which is less than that of the bottom insulating layer 1362, followed by a next, second layer of material, such as a second SiON ("SiON-2") 1384 (with lower nitride content), disposed next to the bottom insulating layer 1362 (in other words, between the first layer of material 1382 and the bottom insulating layer 1362) and having a second potential barrier height for holes which is less than that of the bottom insulating layer 1362 but greater than that of the first layer 1382.

The oxinitride, crested-barrier, bottom injector 1380 provides a lower barrier (lower than oxide) for hole tunneling, from the silicon substrate 1352, through the bottom oxide layer 1366 of the ONO stack 1360, to the storage nitride layer 1364 of the ONO stack 1360, thus facilitating (such as enabling) the erase operation.

Examples of suitable materials for the multi-layer, crested barrier, bottom injector 1380 include, but are not limited to:
oxynitride (SiON), having a potential barrier for holes of approximately 3.2 eV
oxinitride (SiON), having a potential barrier for holes of greater or less than 3.2 eV Whatever materials are used for the bottom injector 1830 should have a lower potential barrier for holes than the bottom insulating layer 1362, therefore complying with the definition of increasing potential barrier for holes from the source of injection to the charge-storage layer.

For a kind of multi-layer crested barrier bottom injector, rather than having multiple distinct layers (such as 1382 and 1384), one or more layers of dielectric material having a gradient, such as from a lowest nitride concentration near the charge-storage stack to a highest nitride concentration toward the substrate, may be inserted so that the potential barrier height peak for holes is highest (yet lower than that of oxide) near the charge-storage stack and gradually (rather than stepwise) decreases toward the substrate.

In order to compensate for the addition of the bottom injector 1380, the bottom oxide layer 1362 of the ONO stack 1360 may be thinner than in a conventional (or "standard") NROM (such as 100, FIG. 1). For example, whereas the bottom oxide layer 112 in a conventional NROM cell may be approximately 4 nm, the bottom oxide layer 1362 in the NROM cell 1350 with a crested barrier, bottom injector may be approximately 3 nm. The thickness of the nitride storage layer 1364 may be approximately 4 nm, or substantially unchanged from the conventional NROM. The thickness of the top oxide layer 1362 may be approximately 12 nm, or substantially unchanged from the standard NROM.

Programming of the NROM cell 1350 may proceed as usual, inserting electrons into the left and right bits 1364L and 1364R of the charge storage layer 1364, such as with CHE or CHISEL injection mechanisms.

To perform erase, by hole tunneling from the substrate, the following voltages may be applied:
the gate voltage (Vg) may be approximately −10v
the diffusion voltages (Vs and Vd) may both be same as substrate or float
the substrate voltage (Vb or Vsub) may be approximately +8v Notice that both diffusions are biased the same, since the erase operation is for the entire cell (both half cells). Also notice that the potential difference between gate and substrate (or gate and well, $V_{GW}$) may be approximately (−) 14-18 volts.

The gate 1370 may be heavily P+ doped poly-Si to suppress electron supply from the poly (gate). When negative Vg is applied, both hole tunneling from silicon and electron tunneling from the poly are possible. In order to reduce the electron tunneling, P+ poly may be used instead of N+ poly. For example, boron (B) at a dose of 1e16/cm$^2$ at energy level of 9 KeV or BF2 at a dose of 1e16/cm$^2$ at an energy level of 40 KeV.

Electron Erase State

In the descriptions set forth hereinabove, performing erase by hole tunneling is discussed. A feature of the disclosure is to enhance hole tunneling during the erase operation, without increasing electron "back tunneling" (including suppressing electron back tunneling). One way of achieving this is to change the structure, such as by adding the injector and P+ poly, as described hereinabove. Another way would be to define an erased state as an electron state, meaning that even in the erased state there will be electrons (a non-zero amount of charge) in the storage nitride. (Usually in NROM, erased state is defined as neutral, or substantially no charge state.) By establishing an electron erase state, there will be electrons in the storage nitride in both the programmed and erased states. Thus, during an erase operation those electrons may attract the holes, thereby enhancing hole tunneling. And, back tunneling of electrons may be suppressed due to the rejection (repulsion) of the stored electrons. Therefore changing the erased state to be an electron state (rather than a neutral state) may enhances hole tunneling and suppresses electron back tunneling during erase.

Bottom Versus Top Injector(s)

Several embodiments of top and bottom injectors have been described hereinabove. There may be some benefits to each. For example (without limitation):

1. In the bottom injector(s) there might be trapping material (such as nitride) as part of the injector. Due to it's location near the channel, the sensitivity to the trapped charge in the injector itself may be large (even greater that to the charge trapped in the storage nitride). As a result the device may be sensitive to the trapping in the injector part, which may harm it's operations since electrons may be trapped in it during programming and holes may be trapped during erase.

2. In the top injector(s) this problem (trapping of charge in the injector) is partially solved, since the injector is located farther from the channel and has much smaller sensitivity and, as such, a lesser influence on the device operation. However when using a top injector, both programming, read and erase may typically be performed with same polarity, meaning with positive gate substrate bias. Therefore the problem of "disturbs" might rise. Since, when one of the cells is programmed, nearby programmed cell on the same wordline may have the same positive gate voltage (Vg) and might start with slow erase. This problem may not exist for the bottom injector(s) due to different operation polarities (programming with positive bias and erase with negative one).

An Exemplary Memory Array

Figure 14:
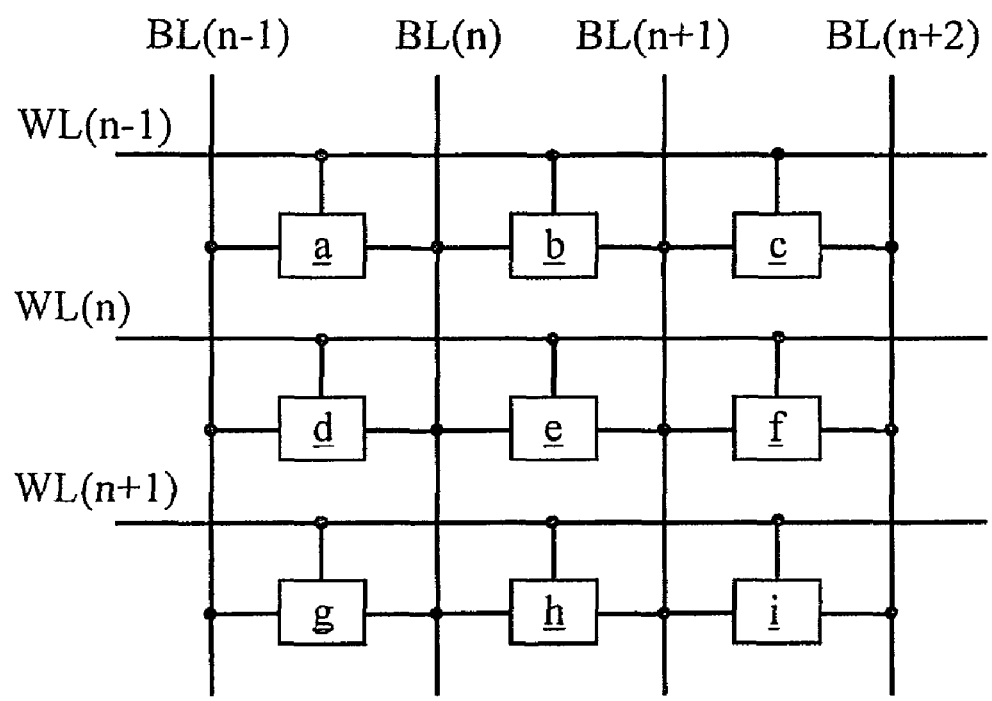
FIG. 14 is a diagram of an array of a plurality (array) of NVM memory cells according to an embodiment of the disclosure.

FIG. 14 illustrates an "array" of a plurality of NVM cells (labeled "a" through "i", also referred to as "cell transistors"), arranged in rows and columns, and connected to a number of word lines (WL) and bit lines (BL). The bitlines (BLs) may extend parallel to each other in one direction (horizontally, as shown) through the array, and the wordlines (WLs) may extend parallel to each other in another direction (vertically, as shown) through the array. The nine memory cells "a" through "i", illustrated in FIG. 14 are exemplary of many millions of memory cells that may be resident on a single semiconductor chip.

The NVM cells "a"-"i" may each have a gate, represented by a line extending upward (as viewed) from the respective memory cell to a wordline, a first diffusion represented by a line extending to the right (as viewed) to a first bitline, and a second diffusion represented by a line extending to the right (as viewed) to a second bitline to the left (as viewed) of the first bitline.

A given wordline (or wordline segment) may be formed as a polysilicon line (or segment) which constitutes gates of a number of NVM cells which are in the same row as one another—for example, the wordline (n) extending across the gates of cells "d", "e" and "f").

A given bitline (or bitline segment) may be formed as first or second diffusions of a number of NVM cells which are in the same column as one another—for example, the bitline (n) extending between the right (as viewed) diffusions of cells "a", "d" and "g", which may also be the left (as viewed) diffusions of cells "b", "e" and "h". Such a bitline may be referred to as a "buried bitline" (BB) or as a "diffusion bitline" (DBL), both of which are formed (as diffusions) within the surface of the substrate (not shown).

An inter-level dielectric (ILD, not shown), may be disposed on the substrate to support patterns of metallization for connecting (via contacts, not shown) to the wordlines and bitlines. For example, a portion of the pattern may comprise metal bitlines (MBLs). Contacts to the buried bitlines (BBLs) may be made by metal-filled plugs extending through the ILD to the buried bitlines, such as at intervals of every 16 cells.

The NVM cells shown in FIG. 14 may be charge-trapping devices such as NROM (sometimes referred to as Nitride Read Only Memory), SONOS (Semiconductor Oxide Nitride Oxide Semiconductor; Silicon-Oxide-Nitride-Oxide-Silicon), SANOS (Silicon-Aluminum Oxide-Nitride-Oxide-Silicon), MANOS (Metal-Aluminum Oxide-Nitride-Oxide-Silicon), and TANOS (Tantalum-Aluminum Oxide-Nitride- Oxide-Silicon), and also to Floating Gate (FG) devices, and may incorporate the crested barrier injector technique(s) disclosed herein.

While a number of exemplary aspects and embodiments have been discussed above, those of skill in the art will recognize certain modifications, permutations, additions and sub-combinations thereof. It is therefore intended that the following appended claims and claims hereafter introduced be interpreted to include all such modifications, permutations, additions and sub-combinations.

What is claimed is:

1. A nonvolatile memory (NVM) cell comprising:
 a charge-storage stack comprising a charge-storage layer; a channel and a gate, between which said stack is disposed, wherein said channel or said gate is a hole source; and
 an injector disposed between said charge-storage stack and said hole source, wherein said injector comprises a hole permissive layer.

2. The NVM cell according to claim 1, wherein said hole permissive layer is composed of a material having a potential barrier for holes which is lower than that of an interface of said charge-storage stack.

3. The NVM cell of claim 1, wherein said injector comprises a layer of material having a valence band energy which is higher than that of a top insulating layer of the charge-storage stack.

4. The NVM cell of claim 1, wherein said charge storage layer is composed of charge trapping type material.

5. The NVM cell of claim 4, wherein said charge trapping type material is silicon nitride.

6. The NVM cell of claim 5, wherein said NVM cell is of a type selected from the group consisting of NROM, SONOS, SANOS, MANOS and TANOS.

7. The NVM cell of claim 1, wherein said charge storage stack includes one or more insulating layers disposed between said charge storage layer and said gate or channel.

8. The NVM cell of claim 7, wherein said insulating layer comprises oxide and said injector comprises a material selected from the group consisting of nitride (SiN), oxinitride (SiON), and silicon-rich nitride (SiRN).

9. The NVM cell of claim 8, wherein said injector is disposed between said stack and said gate.

10. The NVM cell of claim 8, wherein said injector is disposed between said stack and said channel.

11. The NVM cell of claim 1, wherein said injector comprises a hole permissive layer comprised of gradated hole barrier material having increasing hole-barrier properties moving away from said hole source.

12. The NVM cell of claim 11, wherein said gradated hole barrier material is comprised of at least two layers of dielectric materials arranged such that a potential barrier height peak for holes is near an interface between the injector and said charge-storage stack.

13. The NVM cell of claim 1, wherein: said injector comprises at least one layer of a hole permissive material having a potential barrier for holes which is lower than that of an interface of the charge-storage stack; and said at least one layer of hole permissive material comprises: a first layer of material disposed next to said hole source and having a first potential barrier for holes which is lower than that of an insulating layer of said charge-storage stack; and a second layer of material disposed between the first layer of material and said insulating layer of the charge-storage stack and having a second potential barrier for holes which is lower than that of said insulating layer of the charge-storage stack and higher than that of said first layer of material.

14. The NVM cell of claim 13, wherein: said first layer of material is selected from the group consisting of nitride (SiN) and silicon-rich nitride (SiRN); and said second layer of material comprises oxinitride (SiON).

15. A nonvolatile memory (NVM) cell comprising:
 a charge-storage stack comprising a charge-storage layer; a channel and a gate, between which said stack is disposed, wherein said channel or said gate is a hole source; and
 an injector disposed between said charge-storage stack and said hole source, wherein said injector comprises a layer of material having a valence band energy which is higher than that of a top insulating layer of the charge-storage stack.

16. The NVM cell according to claim 15, wherein said injector comprises a hole permissive layer.

17. The NVM cell according to claim 16, wherein said hole permissive layer is composed of a material having a potential barrier for holes which is lower than that of an interface of said charge-storage stack.

18. The NVM cell of claim 15, wherein said charge storage layer is composed of charge trapping type material.

19. The NVM cell of claim 18, wherein said charge trapping type material is silicon nitride.

20. The NVM cell of claim 19, wherein said NVM cell is of a type selected from the group consisting of NROM, SONOS, SANOS, MANOS and TANOS.

21. The NVM cell of claim 15, wherein said charge storage stack includes one or more insulating layers disposed between said charge storage layer and said gate or channel.

22. The NVM cell of claim 21, wherein said insulating layer comprises oxide and said injector comprises a material selected from the group consisting of nitride (SiN), oxinitride (SiON), and silicon-rich nitride (SiRN).

23. The NVM cell of claim 22, wherein said injector is disposed between said stack and said gate.

24. The NVM cell of claim 22, wherein said injector is disposed between said stack and said channel.

25. The NVM cell of claim 15, wherein said injector comprises a hole permissive layer comprised of gradated hole barrier material having increasing hole-barrier properties moving away from said hole source.

26. The NVM cell of claim 25, wherein said gradated hole barrier material is comprised of at least two layers of dielectric materials arranged such that a potential barrier height peak for holes is near an interface between the injector and said charge-storage stack.

27. The NVM cell of claim 15, wherein: said injector comprises at least one layer of a hole permissive material having a potential barrier for holes which is lower than that of an interface of the charge-storage stack; and said at least one layer of hole permissive material comprises: a first layer of material disposed next to said hole source and having a first potential barrier for holes which is lower than that of an insulating layer of said charge-storage stack; and a second layer of material disposed between the first layer of material and said insulating layer of the charge-storage stack and having a second potential barrier for holes which is lower than that of said insulating layer of the charge-storage stack and higher than that of said first layer of material.

28. The NVM cell of claim 27, wherein: said first layer of material is selected from the group consisting of nitride (SiN) and silicon-rich nitride (SiRN); and said second layer of material comprises oxinitride (SiON).

29. A nonvolatile memory (NVM) cell comprising:
a charge-storage stack comprising a charge-storage layer; a channel and a gate, between which said stack is disposed, wherein said channel or said gate is a hole source; and
an injector disposed between said charge-storage stack and said hole source, wherein said injector comprises a hole permissive layer comprised of gradated hole barrier material having increasing hole-barrier properties moving away from said hole source.

30. The NVM cell according to claim 29, wherein said injector comprises a hole permissive layer.

31. The NVM cell according to claim 30, wherein said hole permissive layer is composed of a material having a potential barrier for holes which is lower than that of an interface of said charge-storage stack.

32. The NVM cell according to claim 29, wherein said injector comprises a layer of material having a valence band energy which is higher than that of a top insulating layer of the charge-storage stack.

33. The NVM cell of claim 29, wherein said charge storage layer is composed of charge trapping type material.

34. The NVM cell of claim 33, wherein said charge trapping type material is silicon nitride.

35. The NVM cell of claim 34, wherein said NVM cell is of a type selected from the group consisting of NROM, SONOS, SANOS, MANOS and TANOS.

36. The NVM cell of claim 29, wherein said charge storage stack includes one or more insulating layers disposed between said charge storage layer and said gate or channel.

37. The NVM cell of claim 36, wherein said insulating layer comprises oxide and said injector comprises a material selected from the group consisting of nitride (SiN), oxinitride (SiON), and silicon-rich nitride (SiRN).

38. The NVM cell of claim 37, wherein said injector is disposed between said stack and said gate.

39. The NVM cell of claim 37, wherein said injector is disposed between said stack and said channel.

40. The NVM cell of claim 29, wherein said gradated hole barrier material is comprised of at least two layers of dielectric materials arranged such that a potential barrier height peak for holes is near an interface between the injector and said charge-storage stack.

41. The NVM cell of claim 29, wherein: said injector comprises at least one layer of a hole permissive material having a potential barrier for holes which is lower than that of an interface of the charge-storage stack; and said at least one layer of hole permissive material comprises: a first layer of material disposed next to said hole source and having a first potential barrier for holes which is lower than that of an insulating layer of said charge-storage stack; and a second layer of material disposed between the first layer of material and said insulating layer of the charge-storage stack and having a second potential barrier for holes which is lower than that of said insulating layer of the charge-storage stack and higher than that of said first layer of material.

42. The NVM cell of claim 41, wherein: said first layer of material is selected from the group consisting of nitride (SiN) and silicon-rich nitride (SiRN); and said second layer of material comprises oxinitride (SiON).

43. A nonvolatile memory (NVM) cell comprising:
a charge-storage stack comprising a charge-storage layer; a channel and a gate, between which said stack is disposed, wherein said channel or said gate is a hole source; and
an injector disposed between said charge-storage stack and said hole source, wherein said injector comprises at least one layer of a hole permissive material having a potential barrier for holes which is lower than that of an interface of the charge-storage stack; and said at least one layer of hole permissive material comprises:
a first layer of material disposed next to said hole source and having a first potential barrier for holes which is lower than that of an insulating layer of said charge-storage stack; and
a second layer of material disposed between the first layer of material and said insulating layer of the charge-storage stack and having a second potential barrier for holes which is lower than that of said insulating layer of the charge-storage stack and higher than that of said first layer of material.

44. The NVM cell according to claim 43, wherein said injector comprises a hole permissive layer.

45. The NVM cell according to claim 44, wherein said hole permissive layer is composed of a material having a potential barrier for holes which is lower than that of an interface of said charge-storage stack.

46. The NVM cell according to claim 43, wherein said injector comprises a layer of material having a valence band energy which is higher than that of a top insulating layer of the charge-storage stack.

47. The NVM cell of claim 43, wherein said charge storage layer is composed of charge trapping type material.

48. The NVM cell of claim 47, wherein said charge trapping type material is silicon nitride.

49. The NVM cell of claim 48, wherein said NVM cell is of a type selected from the group consisting of NROM, SONOS, SANOS, MANOS and TANOS.

50. The NVM cell of claim 43, wherein said charge storage stack includes one or more insulating layers disposed between said charge storage layer and said gate or channel.

51. The NVM cell of claim 50, wherein said insulating layer comprises oxide and said injector comprises a material selected from the group consisting of nitride (SiN), oxinitride (SiON), and silicon-rich nitride (SiRN).

52. The NVM cell of claim 51, wherein said injector is disposed between said stack and said gate.

53. The NVM cell of claim 51, wherein said injector is disposed between said stack and said channel.

54. The NVM cell of claim 43, wherein said injector comprises a hole permissive layer comprised of gradated hole barrier material having increasing hole-barrier properties moving away from said hole source.

55. The NVM cell of claim 54, wherein said gradated hole barrier material is comprised of at least two layers of dielectric materials arranged such that a potential barrier height peak for holes is near an interface between the injector and said charge-storage stack.

56. The NVM cell of claim 43, wherein: said first layer of material is selected from the group consisting of nitride (SiN) and silicon-rich nitride (SiRN); and said second layer of material comprises oxinitride (SiON).

* * * * *